US012685176B2

(12) United States Patent
Tomita et al.

(10) Patent No.: US 12,685,176 B2
(45) Date of Patent: Jul. 14, 2026

(54) RADIO-FREQUENCY MODULE AND COMMUNICATION DEVICE

(71) Applicant: Murata Manufacturing Co., Ltd., Nagaokakyo (JP)

(72) Inventors: Naohide Tomita, Nagaokakyo (JP); Hiroshi Nishikawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 377 days.

(21) Appl. No.: 18/451,857

(22) Filed: Aug. 18, 2023

(65) Prior Publication Data

US 2023/0395536 A1 Dec. 7, 2023

Related U.S. Application Data

(63) Continuation of application No. PCT/JP2021/048494, filed on Dec. 27, 2021.

(30) Foreign Application Priority Data

Mar. 2, 2021 (JP) ................................. 2021-033008

(51) Int. Cl.
*H10W 44/20* (2026.01)
*H10W 20/20* (2026.01)
(Continued)

(52) U.S. Cl.
CPC ........... *H10W 44/20* (2026.01); *H10W 20/20* (2026.01); *H10W 20/42* (2026.01);
(Continued)

(58) Field of Classification Search
CPC . H01L 23/66; H01L 23/481; H01L 23/49805; H01L 23/49838; H01L 23/5226;
(Continued)

(56) References Cited

U.S. PATENT DOCUMENTS

2006/0160505 A1* 7/2006 Ichitsubo ................ H03F 3/195
455/127.1
2016/0343685 A1* 11/2016 Lin ......................... H01L 21/78
(Continued)

FOREIGN PATENT DOCUMENTS

JP 2015-109379 A 6/2015
JP 2019-033178 A 2/2019
(Continued)

OTHER PUBLICATIONS

International Search Report and Written Opinion mailed on Mar. 22, 2022, received for PCT Application PCT/JP2021/048494, filed on Dec. 27, 2021, 10 pages including English Translation.

*Primary Examiner* — Tu-Tu V Ho
(74) *Attorney, Agent, or Firm* — XSENSUS LLP

(57) ABSTRACT

A radio frequency module includes a mounting substrate including a first main surface and a second main surface opposite to the first main surface. A first electronic component is disposed on the first main surface of the mounting substrate. A second electronic component is disposed on the second main surface of the mounting substrate. A plurality of connection terminals are disposed on the second main surface of the mounting substrate. A wiring layer faces the second main surface of the mounting substrate. The wiring layer includes a plurality of external connection electrodes, each connected to at least one of the second electronic component and the plurality of connection terminals. At least one of the plurality of external connection electrodes overlaps the second electronic component when viewed in plan in a thickness direction of the substrate.

18 Claims, 12 Drawing Sheets

(51) Int. Cl.
_H10W 20/42_ (2026.01)
_H10W 70/60_ (2026.01)
_H10W 70/65_ (2026.01)
_H10W 72/90_ (2026.01)
_H10W 80/00_ (2026.01)
_H10W 90/00_ (2026.01)

(52) U.S. Cl.
CPC ......... _H10W 70/614_ (2026.01); _H10W 70/65_
(2026.01); _H10W 70/657_ (2026.01); _H10W
44/209_ (2026.01); _H10W 44/234_ (2026.01);
_H10W 44/248_ (2026.01); _H10W 72/926_
(2026.01); _H10W 72/9415_ (2026.01); _H10W
72/9445_ (2026.01); _H10W 80/721_ (2026.01);
_H10W 80/743_ (2026.01); _H10W 90/722_
(2026.01)

(58) Field of Classification Search
CPC ..... H01L 23/5389; H01L 24/08; H01L 24/09;
H01L 24/16; H01L 2223/6616; H01L
2223/6655; H01L 2223/6677; H01L
2224/08112; H01L 2224/0903; H01L
2224/09177; H01L 2224/16145; H10W
44/20; H10W 70/65; H10W 70/614;
H10W 70/657; H10W 20/20; H10W
20/42; H10W 80/721; H10W 80/743;
H10W 44/234; H10W 44/248; H10W
44/209; H10W 72/9445; H10W 72/926;
H10W 72/9415; H10W 90/722
USPC ........................................................ 257/728
See application file for complete search history.

(56) References Cited

U.S. PATENT DOCUMENTS

2019/0006309 A1 1/2019 Jeng et al.
2020/0203291 A1* 6/2020 Uejima .................. H01L 25/18
2021/0098421 A1* 4/2021 Wu ..................... H01L 23/3675

FOREIGN PATENT DOCUMENTS

JP 2020-126921 A 8/2020
WO 2013/035714 A1 3/2013
WO 2020/071021 A1 4/2020

* cited by examiner

RADIO-FREQUENCY MODULE AND COMMUNICATION DEVICE

CROSS-REFERENCE TO RELATED APPLICATIONS

This application is a continuation of international application no. PCT/JP2021/048494, filed Dec. 27, 2021, and which claims priority to Japanese patent application no. JP 2021-033008, filed Mar. 2, 2021. The entire contents of all prior applications are hereby incorporated by reference.

TECHNICAL FIELD

The present disclosure generally relates to a radio-frequency module and a communication device and, for example, to a radio frequency module including a mounting substrate, electronic components, and connection terminals and to a communication device including the radio frequency module.

BACKGROUND ART

A radio frequency module may include a module substrate (a mounting substrate), a semiconductor IC (a second electronic component), columnar electrodes (connection terminals), filters, and an inductor (first electronic components). The module substrate has a first main surface and a second main surface on opposite sides. The filters and the inductor are disposed on the first main surface of the module substrate. The semiconductor IC and the columnar electrodes are disposed on the second main surface of the module substrate.

CITATION LIST

Patent Document

Patent Document 1: International Publication No. 2020/071021

SUMMARY

Technical Problem

With the second electronic component being disposed on the second main surface of the mounting substrate, the connection terminals of the radio frequency module cannot be disposed on the mounting space for the second electronic component on the second main surface of the mounting substrate. For this reason, the number of external connection terminals (terminals for connection to the outside) that can be included in such a conventional radio-frequency module is limited.

The present disclosure therefore has been made in view of the aforementioned circumstances, and provides a radio-frequency module and a communication apparatus that can include a greater number of terminals for connection to the outside.

Solution to Problem

A radio frequency module according to an exemplary aspect of the present disclosure includes a mounting substrate, a first electronic component, a second electronic component, a plurality of connection terminals, and a wiring layer. The mounting substrate has a first main surface and a second main surface on opposite sides. The first electronic component is disposed on the first main surface of the mounting substrate. The second electronic component is disposed on the second main surface of the mounting substrate. The plurality of connection terminals are disposed on the second main surface of the mounting substrate. The wiring layer faces the second main surface of the mounting substrate. The wiring layer includes a plurality of external connection electrodes. The plurality of external connection electrodes are each connected to at least one of the second electronic component and the plurality of connection terminals. At least one of the plurality of external connection electrodes overlaps the second electronic component when viewed in plan in a thickness direction of the mounting substrate.

A communication device according to another exemplary aspect of the present disclosure includes the radio-frequency module and a signal processing circuit. The signal processing circuit processes signals flowing through the radio frequency module.

Advantageous Effects

A radio frequency module includes a mounting substrate including a first main surface and a second main surface opposite to the first main surface. A first electronic component is disposed on the first main surface of the mounting substrate. A second electronic component is disposed on the second main surface of the mounting substrate. A plurality of connection terminals are disposed on the second main surface of the mounting substrate. A wiring layer faces the second main surface of the mounting substrate. The wiring layer includes a plurality of external connection electrodes, each connected to at least one of the second electronic component and the plurality of connection terminals. At least one of the plurality of external connection electrodes overlaps the second electronic component when viewed in plan in a thickness direction of the substrate.

BRIEF DESCRIPTION OF DRAWINGS

FIG. 4 is a schematic diagram of a communication device according to exemplary Embodiment 1.
FIG. 8 is a sectional view of the radio frequency module.
FIG. 9 is a sectional view of a radio frequency module according to exemplary Embodiment 5.
FIG. 10 is a sectional view of a radio frequency module according to exemplary Embodiment 6.
FIG. 13 is a sectional view of a radio frequency module according to exemplary Embodiment 9.

DETAILED DESCRIPTION

Figure 1:
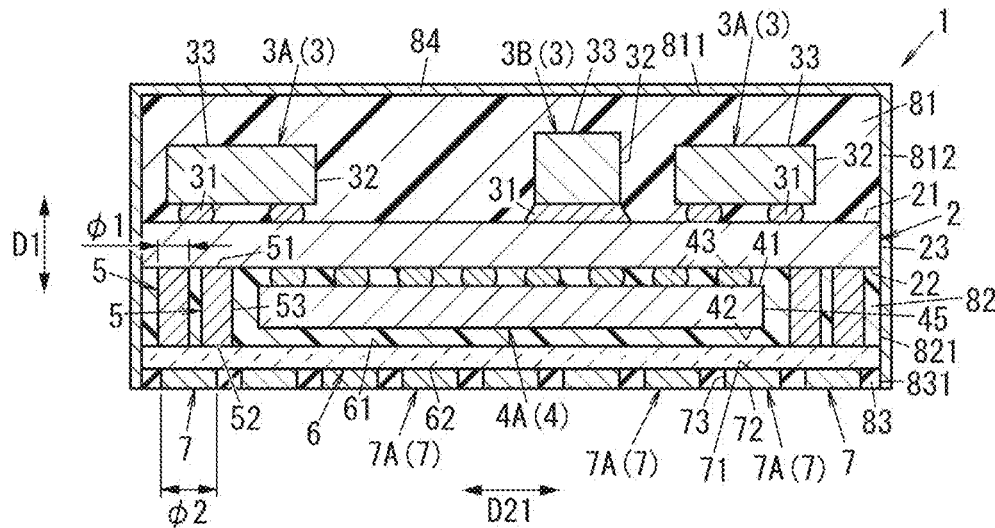
FIG. 1 is a sectional view of a radio frequency module according to exemplary Embodiment 1.

The following describes, with reference to the drawings, radio frequency modules according to exemplary Embodiment 1 to 10 and a communication device. The drawings, which will be referred to in relation to, for example, the following exemplary embodiments, are schematic diagrams, in which constituent elements are not drawn to scale and the size and thickness ratios thereof do not necessarily fully correspond to the actual dimension ratios.

Embodiment 1

(1) Radio-Frequency Module

The following describes the configuration of a radio-frequency module 1 according to exemplary Embodiment 1 with reference to the drawings.

Figure 4:
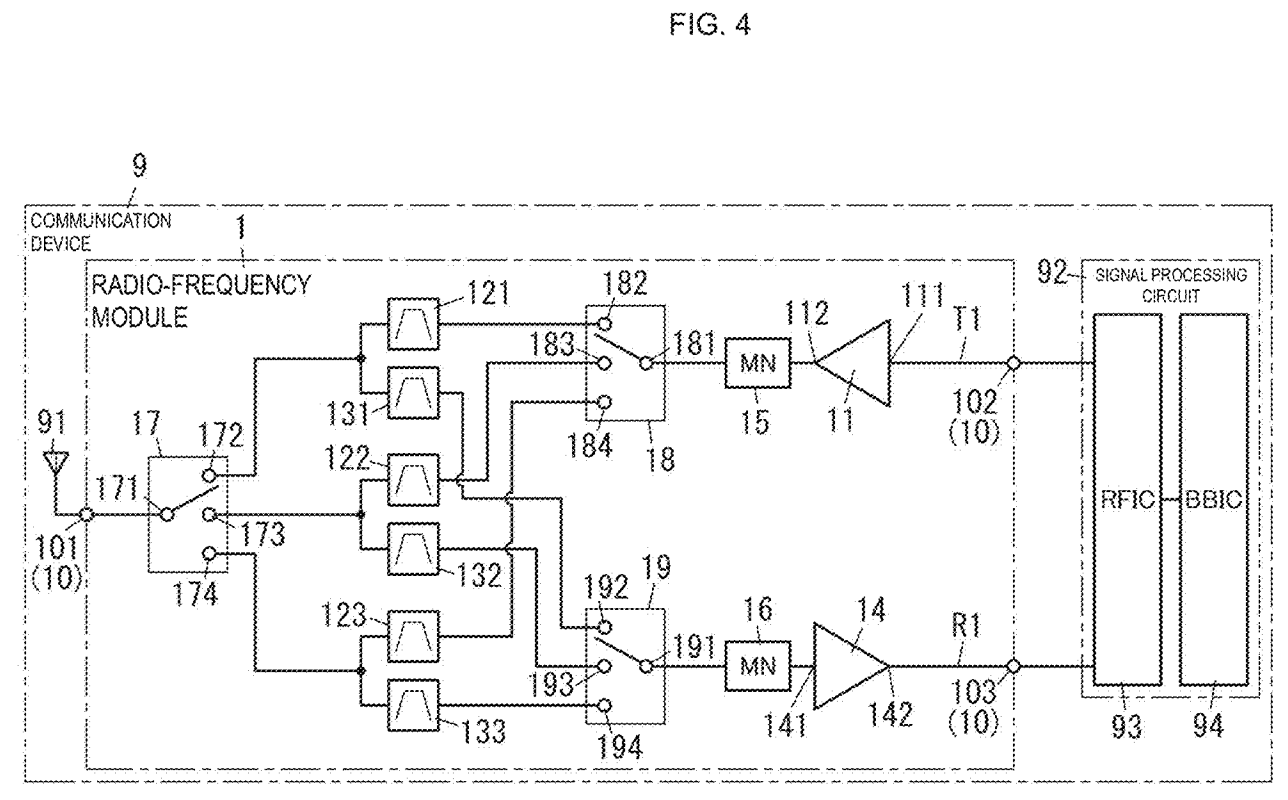

Referring to FIG. 4, the radio frequency module 1 is included in, for example, a communication device 9. The communication device 9 is a mobile phone, such as a smartphone. It is not required that the communication device 9 be a mobile phone. For example, the communication device 9 may be a wearable terminal, such as a smart watch. The radio frequency module 1 supports, for example, the fourth-generation mobile communication (4G) standard or the fifth-generation mobile communication (5G) standard. The 4G standard is, for example, the third generation partnership project (3GPP) Long Term Evolution (LTE) standard. The 5G standard is, for example, 5G New Radio (NR). The radio-frequency module 1 supports, for example, carrier aggregation and dual connectivity.

The communication device 9 carries out communication in two or more communication bands. More specifically, the communication device 9 transmits transmission signals in two or more communication bands and receive reception signals in two or more communication bands.

For example, the transmission signals and the reception signals in two or more communication bands may be signals for frequency division duplex (FDD). Alternatively, the transmission signals and the reception signals in two or more communication bands may be signals for time division duplex (TDD). FDD is a wireless communications technology that employs separate frequency bands for transmission and reception in wireless communications. TDD is a wireless communications technology where transmission and reception in wireless communications are performed in the same frequency band at different time slots.

(2) Circuit Configuration of Radio-Frequency Module

The following describes the configuration of the radio-frequency module 1 according to exemplary Embodiment 1 with reference to FIG. 4.

Referring to FIG. 4, the radio frequency module 1 according to Embodiment 1 includes a power amplifier 11, transmitting filters (e.g., three filters respectively denoted by 121 to 123), receiving filters (e.g., three filters respectively denoted by 131 to 133), a low-noise amplifier 14, an output matching circuit 15, an input matching circuit 16, a first switch 17, a second switch 18, and a third switch 19.

(2.1) Power Amplifier

The power amplifier 11 illustrated in FIG. 4 amplifies transmission signals (radio frequency signals). The power amplifier 11 is disposed on a transmission path T1, which forms a connection between an antenna terminal 101 and a signal input terminal 102. The terminals 101 and 102 will be described later. The power amplifier 11 on the transmission path T1 is located between the signal input terminal 102 and the transmitting filters 121 to 123. The power amplifier 11 includes an input terminal 111 and an output terminal 112. The input terminal 111 of the power amplifier 11 is connected to an external circuit (e.g., a signal processing circuit 92) with the signal input terminal 102 interposed therebetween. The output terminal 112 of the power amplifier 11 is connected to the transmitting filters 121 to 123. The power amplifier 11 is controlled by, for example, a controller (not illustrated). The power amplifier 11 may be connected directly or indirectly to the transmitting filters 121 to 123. Referring to FIG. 4, the power amplifier 11 is connected to the transmitting filters 121 to 123 with the output matching circuit 15 interposed therebetween. The output matching circuit 15 on the transmission path T1 is located between the power amplifier 11 and the transmitting filters 121 to 123. The output matching circuit 15 provides impedance matching between the power amplifier 11 and the transmitting filters 121 to 123.

(2.2) Transmitting Filters

The transmitting filters 121 to 123 illustrated in FIG. 4 allow passage of transmission signals in their respective communication bands. The transmitting filters 121 to 123 on the transmission path T1 are located between the power amplifier 11 and the first switch 17. Out of radio-frequency signals amplified by the power amplifier 11, transmission signals in the transmission bands within the communication bands pass through the transmitting filters 121 to 123 pass through the respective transmitting filters.

(2.3) Receiving Filters

The receiving filters 131 to 133 illustrated in FIG. 4 allow passage of reception signals in their respective communication bands. The receiving filters 131 to 133 are disposed on a reception path R1, which forms a connection between the antenna terminal 101 and a signal output terminal 103. The terminals 101 and 103 will be described later. The receiving filters 131 to 133 on the reception path R1 is located between the first switch 17 and the low-noise amplifier 14. Out of radio frequency signals input through the antenna terminal 101, reception signals in the reception bands within the communication bands pass through the receiving filters 131 to 133.

(2.4) Low-Noise Amplifier

The low-noise amplifier 14 illustrated in FIG. 4 amplifies reception signals while reducing unwanted noise. The low-noise amplifier 14 on the reception path R1 is located between the signal output terminal 103 and the receiving filters 131 to 133. The low-noise amplifier 14 includes an input terminal 141 and the output terminal 142. The input terminal 141 of the low-noise amplifier 14 is connected to the input matching circuit 16. The output terminal 142 of the low-noise amplifier 14 is connected to an external circuit (e.g., the signal processing circuit 92) with the signal output terminal 103 interposed therebetween.

(2.5) Output Matching Circuit

As illustrated in FIG. 4, the output matching circuit 15 on the transmission path T1 is located between the power amplifier 11 and the transmitting filters 121 to 123. The output matching circuit 15 is a circuit for providing impedance matching between the power amplifier 11 and the transmitting filters 121 to 123.

The output matching circuit 15 includes an inductor (not illustrated). The inductor on the transmission path T1 is located on the output side of the power amplifier 11. It is not required that one inductor be included in the output matching circuit 15. For example, the output matching circuit 15 may include two or more inductors or may include two or more inductors and two or more capacitors. That is, the output matching circuit 15 includes at least one inductor.

(2.6) Input Matching Circuit

As illustrated in FIG. 4, the input matching circuit 16 is disposed on the reception path R1, and the input matching circuit 16 on the reception path R1 is located between the low-noise amplifier 14 and the receiving filters 131 to 133. The input matching circuit 16 is a circuit for providing impedance matching between the low-noise amplifier 14 and the receiving filters 131 to 133.

The input matching circuit 16 includes an inductor (not illustrated). The inductor on the reception path R1 is located on the input side of the low-noise amplifier 14. It is not required that one inductor be included in the input matching circuit 16. For example, the input matching circuit 16 may include two or more inductors or may include two or more inductors and two or more capacitors. That is, the input matching circuit 16 includes at least one inductor.

(2.7) First Switch

The first switch 17 illustrated in FIG. 4 enables switching among the transmitting filters 121 to 123 for connection to the antenna terminal 101. The first switch 17 also enables switching among the receiving filters 131 to 133 for connection to the antenna terminal 101. That is, the first switch 17 enables switching among the paths for connection to an antenna 91, which will be described later. The first switch 17 includes a common terminal 171 and selection terminals (e.g., three terminals respectively denoted by 172 to 174). The common terminal 171 is connected to the antenna terminal 101. The selection terminals 172 to 174 are each connected to at least one of the transmitting filters 121 to 123 and/or at least one of the receiving filters 131 to 133. Referring to FIG. 4, the selection terminals 172 to 174 are each connected to one of the transmitting filters 121 to 123 and one of the receiving filters 131 to 133. For example, the selection terminal 172 is connected to the transmitting filter 121 and the receiving filter 131. The selection terminal 173 is connected to the transmitting filter 122 and the receiving filter 132. The selection terminal 174 is connected to the transmitting filter 123 and the receiving filter 133.

The first switch 17 enables switching between the common terminal 171 and the selection terminals 172 to 174. The first switch 17 is controlled by, for example, the signal processing circuit 92. The first switch 17 performs switching in accordance with a control signal from an RF signal processing circuit 93 in the signal processing circuit 92 such that the common terminal 171 is electrically connected to at least one of the selection terminals 172 to 174.

(2.8) Second Switch

The second switch 18 illustrated in FIG. 4 enables switching among the transmitting filters 121 to 123 for connection to the power amplifier 11. That is, the second switch 18 enables switching among the paths for connection to the power amplifier 11. The second switch 18 includes a common terminal 181 and selection terminals (e.g., three terminals respectively denoted by 182 to 184). The common terminal 181 is connected to the power amplifier 11. The selection terminals 182 to 184 are each connected to at least one of the transmitting filters 121 to 123. Referring to FIG. 4, the selection terminals 182 to 184 are each connected to one of the transmitting filters 121 to 123. For example, the selection terminal 182 is connected to the transmitting filter 121. The selection terminal 183 is connected to the transmitting filter 122. The selection terminal 184 is connected to the transmitting filter 123.

The second switch 18 enables switching between the common terminal 181 and the selection terminals 182 to 184. The second switch 18 is controlled by, for example, the signal processing circuit 92. The second switch 18 performs switching in accordance with a control signal from the RF signal processing circuit 93 in the signal processing circuit 92 such that the common terminal 181 is electrically connected to at least one of the selection terminals 182 to 184.

(2.9) Third Switch

The third switch 19 illustrated in FIG. 4 enables switching among the receiving filters 131 to 133 for connection to the low-noise amplifier 14. That is, the third switch 19 enables switching among the paths for connection to the low-noise amplifier 14. The third switch 19 includes a common terminal 191 and selection terminals (e.g., three terminals respectively denoted by 192 to 194). The common terminal 191 is connected to the low-noise amplifier 14. The selection terminals 192 to 194 are each connected to at least one of the receiving filters 131 to 133. Referring to FIG. 4, the selection terminals 192 to 194 are each connected to one of the receiving filters 131 to 133. More specifically, the selection terminal 192 is connected to the receiving filter 131. The selection terminal 193 is connected to the receiving filter 132. The selection terminal 194 is connected to the receiving filter 133.

The third switch 19 enables switching between the common terminal 191 and the selection terminals 192 to 194. The third switch 19 is controlled by, for example, the signal processing circuit 92. The third switch 19 performs switching in accordance with a control signal from the RF signal processing circuit 93 in the signal processing circuit 92 such that the common terminal 191 is electrically connected to at least one of the selection terminals 192 to 194.

(2.10) External Connection Terminals

Referring to FIG. 4, external connection terminals 10 are terminals for electrical connection to an external circuit (e.g., the signal processing circuit 92). The external connection terminals 10 include the antenna terminal 101, the signal input terminal 102, the signal output terminal 103, and ground terminals.

The antenna terminal 101 is connected to the antenna 91. The antenna terminal 101 is connected to the first switch 17 in the radio frequency module 1. The antenna terminal 101 may be connected to the transmitting filters 121 to 123 and the receiving filters 131 to 133 by the first switch 17.

Transmission signals from an external circuit (e.g., the signal processing circuit 92) are input to the radio-frequency module 1 through the signal input terminal 102. The signal input terminal 102 is connected to the power amplifier 11 in the radio frequency module 1.

Reception signals from the low-noise amplifier 14 are output to an external circuit (e.g., the signal processing circuit 92) through the signal output terminal 103. The signal output terminal 103 is connected to the low-noise amplifier 14 in the radio frequency module 1.

(3) Structure of Radio-Frequency Module

The following describes the structure of the radio-frequency module 1 according to exemplary Embodiment 1 with reference to the drawings.

Figure 2:
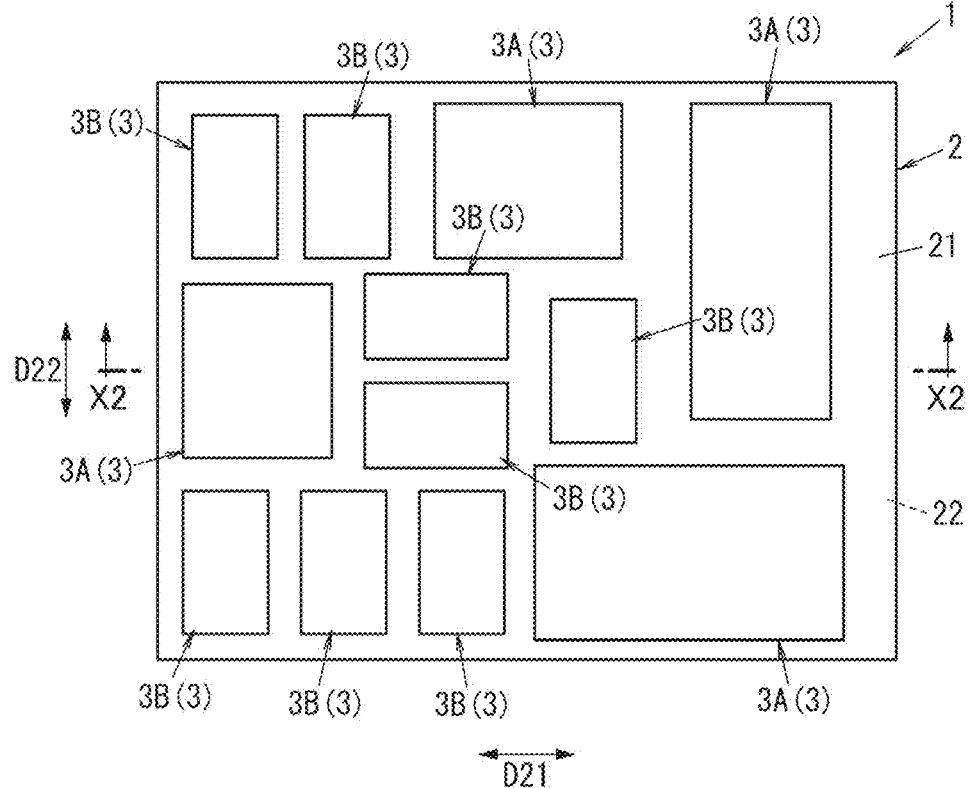
FIG. 2 is a plan view of the radio frequency module.
Figure 3:
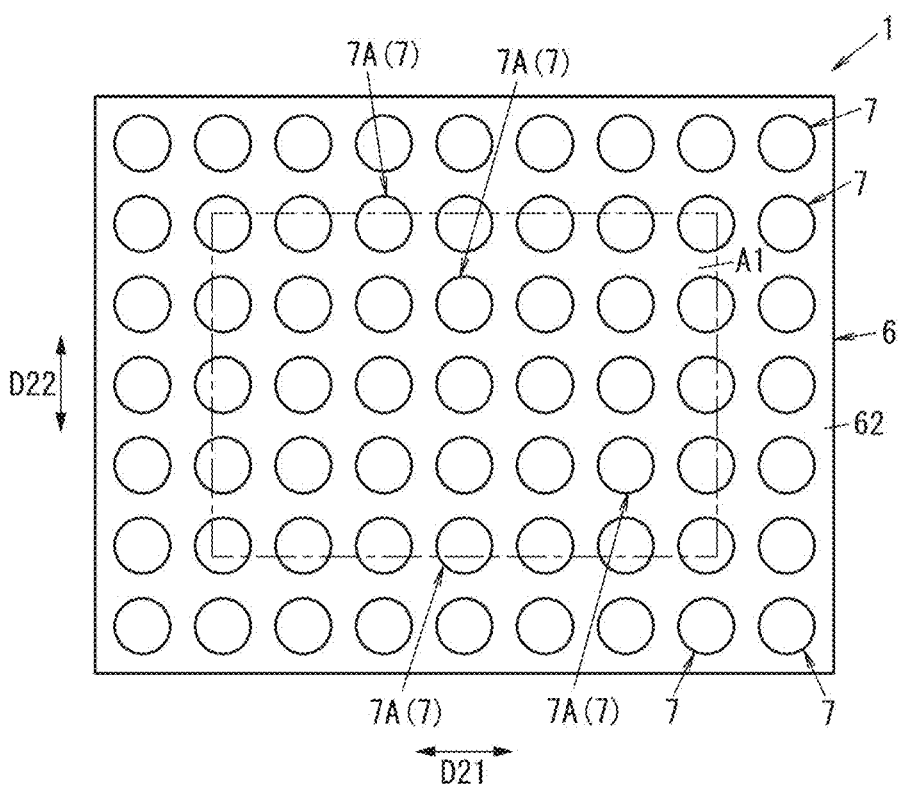
FIG. 3 is a bottom view of the radio frequency module.

Referring to FIGS. 1 to 3, the radio frequency module 1 includes a mounting substrate 2, first electronic components 3, a second electronic component 4, connection terminals 5, a substrate 6, and external connection electrodes 7. The radio frequency module 1 also includes a first resin layer 81, a second resin layer 82, a third resin layer 83, and a shield layer 84. FIG. 1 is a sectional view taken along line X2-X2 in FIG. 2. The first resin layer 81 and the shield layer 84 are not illustrated in FIG. 2. The third resin layer 83 and the shield layer 84 are not illustrated in FIG. 3.

The radio frequency module 1 can be electrically connected to an external substrate (not illustrated). For example, the external substrate is a motherboard of a communication device 9, which is a mobile phone or any other communication device. For electrical connection to the external substrate, the radio frequency module 1 may be mounted directly or indirectly on the external substrate. For example, the radio frequency module 1 may be mounted on another radio frequency module on the external substrate, in which case the radio frequency module 1 mounted on the radio frequency module other than the radio frequency module 1 may be regarded as being mounted indirectly on the external substrate.

(3.1) Mounting Substrate

Referring to FIG. 1, the mounting substrate 2 has a first main surface 21 and a second main surface 22. The first main surface 21 and the second main surface 22 are located on opposite sides in the thickness direction of the mounting substrate 2. The thickness direction is denoted by D1. The radio frequency module 1 is mounted onto the external substrate (not illustrated), with the second main surface 22 oriented toward the external substrate. The mounting substrate 2 is a double-sided mounting substrate where both the first main surface 21 and the second main surface 22 are mounting places for electronic components.

The mounting substrate 2 is a multilayer substrate including dielectric layers stacked on top of one another. In other words, the mounting substrate 2 includes multiple dielectric layers. The mounting substrate 2 also includes conductive layers and via conductors (through-via electrodes and the like). One of the electrically conductive layers is a ground layer placed at the ground potential. The via conductors are, for example, used to electrically connect elements on the first main surface 21 and elements on the second main surface 22, such as the electronic components mentioned above, to an electrically conductive layer of the mounting substrate 2. The via conductors may also be used to electrically connect the elements on the first main surface 21 to the elements on the second main surface 22 and to electrically connect the conductive layer of the mounting substrate 2 to the connection terminals 5.

The first main surface 21 of the mounting substrate 2 is a mounting place for the first electronic components 3. The second main surface 22 of the mounting substrate 2 is a mounting place for the second electronic component 4. The second main surface 22 of the mounting substrate 2 is also a mounting place for the connection terminals 5.

(3.2) First Electronic Components

As illustrated in FIGS. 1 and 2, the first electronic components 3 are disposed on the first main surface 21 of the mounting substrate 2. Although all of the first electronic components 3 are mounted on the first main surface 21 of the mounting substrate 2 illustrated in FIG. 1, the first electronic components 3 each may have a part located on the first main surface 21 of the mounting substrate 2, with the other part being located in the mounting substrate 2. That is, the first electronic components 3 are each closer to the first main surface 21 of the mounting substrate 2 than to the second main surface 22 of the mounting substrate 2 and are each at least partly located on the first main surface 21.

Some of the first electronic components 3 are first electronic components 3A, which are, for example, the transmitting filters 121 to 123 (see FIG. 4). Each of the transmitting filters 121 to 123 is, for example, an acoustic wave filter including series-arm resonators and parallel-arm resonators. For example, the acoustic wave filter is a surface acoustic wave (SAW) filter that uses surface acoustic waves. The transmitting filters 121 to 123 each may include an inductor and/or a capacitor connected in series with any one of the series-arm resonators or may include an inductor or a capacitor connected in series with at least one of the parallel-arm resonators.

The other first electronic components 3 are first electronic components 3B, which are, for example, inductors or capacitors of the output matching circuit 15 (see FIG. 4) or inductors or capacitors of the input matching circuit 16 (see FIG. 4).

(3.3) Second Electronic Component

As illustrated in FIG. 1, the second electronic component 4 is disposed on the second main surface 22 of the mounting substrate 2. Although the second electronic component 4 is mounted on the second main surface 22 of the mounting substrate 2 illustrated in FIG. 1, the second electronic component 4 may have a part located on the second main surface 22 of the second electronic component 4, with the other part being located in the mounting substrate 2. That is, the second electronic component 4 is closer to the second main surface 22 of the mounting substrate 2 than to the first main surface 21 of the mounting substrate 2 and is at least partly located on the second main surface 22.

(3.4) Connection Terminals

Referring to FIG. 1, the connection terminals 5 are terminals for electrical connection between the mounting substrate 2 and the external substrate (not illustrated).

The connection terminals 5 are disposed on the second main surface 22 of the mounting substrate 2. For example, the connection terminals 5 are each be an electrode in the form of a column (e.g., a circular cylinder) on the second main surface 22 of the mounting substrate 2. That is, each of the connection terminals 5 is longer than it is wide. The connection terminals 5 are, for example, made of metal, such as copper or a copper alloy. The connection terminals 5 each have a proximal end portion 51 (a first end portion) and a distal end portion 52 (a second end portion) on opposite sides in the thickness direction D1 of the mounting substrate 2. The proximal end portion 51 is joined to the second main surface 22 of the mounting substrate 2. The distal end portions 52 of the connection terminals 5 each may include an Au plating layer.

(3.5) Substrate

Referring to FIG. 1, the substrate 6 has a third main surface 61 and a fourth main surface 62. The third main surface 61 and the fourth main surface 62 are located on opposite sides in the thickness direction of the substrate 6, that is, on opposite sides in the thickness direction D1 of the mounting substrate 2. The radio frequency module 1 is mounted onto the external substrate (not illustrated), with the fourth main surface 62 oriented toward the external substrate.

The substrate 6 is a multilayer substrate including dielectric layers stacked on top of one another. In other words, the substrate 6 includes multiple dielectric layers. The substrate 6 also includes conductive layers and via conductors (through-via electrodes). One of the electrically conductive layers is a ground layer placed at the ground potential. The via conductors are, for example, used to electrically connect the conductive layers of the substrate 6 to each other. The via conductors may also be used to electrically connect the conductive layers of the substrate 6 to the external connection electrodes 7. The fourth main surface 62 of the substrate 6 is a mounting place for the external connection electrodes 7.

(3.6) External Connection Electrodes

Referring to FIGS. 1 and 3, the external connection electrodes 7 are terminals for electrical connection between the substrate 6 and the external substrate (not illustrated).

The external connection electrodes 7 are disposed on the fourth main surface 62 of the substrate 6. For example, the external connection electrodes 7 are each in the form of a column (e.g., a circular cylinder) on the fourth main surface 62 of the substrate 6. The external connection electrodes 7 are, for example, made of metal, such as copper or a copper alloy. The external connection electrodes 7 each have a proximal end portion 71 (a first end portion) and a distal end portion 72 (a second end portion) on opposite sides in the thickness direction of the substrate 6, that is, on opposite sides in the thickness direction D1 of the mounting substrate 2. The proximal end portion 71 is joined to the fourth main surface 62 of the substrate 6. The distal end portions 72 of the external connection electrodes 7 each may include an Au plating layer.

(3.7) Connection and Positional Relationship Between Substrates and External Connection Electrodes As illustrated in FIGS. 1 to 3, the substrate 6 and the mounting substrate 2 in Embodiment 1 are disposed with the connection terminals 5 sandwiched therebetween. The substrate 6 is electrically connected to the mounting substrate 2 with the connection terminals 5 interposed therebetween.

Referring to FIG. 3, at least two of the external connection electrodes 7 are external connection electrodes 7A, which are disposed in a region A1 on the fourth main surface 62 of the substrate 6. The region A1 overlaps at least the second electronic component 4 when viewed in plan in the thickness direction D1 of the mounting substrate 2. In other words, the at least two external connection electrodes 7A included in the external connection electrodes 7 overlap the second electronic component 4 when viewed in plan in the thickness direction D1 of the mounting substrate 2.

The substrate 6 connects the connection terminals 5 to the external connection electrodes 7. The third main surface 61 of the substrate 6 is connected with the connection terminals 5. The fourth main surface 62 of the substrate 6 is a mounting place for the external connection electrodes 7.

The external connection electrodes 7 are greater in number than the connection terminals 5. The external connection electrodes 7 of the radio frequency module 1 are disposed with a view to, for example, providing greater ease of mounting the radio frequency module 1 onto the external substrate (motherboard) and increasing the number of ground terminals of the radio frequency module 1.

The diameter of each of the connection terminals 5 is not equal to the diameter of each of the external connection electrodes 7 ($\varphi1 \neq \varphi2$). Specifically, $\varphi1$ denotes the diameter of each of the connection terminals 5 viewed in plan in the thickness direction D1 of the mounting substrate 2, and $\varphi2$ denotes the diameter of each of the external connection electrodes 7 viewed in plan in the thickness direction D1 of the mounting substrate 2.

In exemplary Embodiment 1, the diameter $\varphi2$ of each of the external connection electrodes 7 is greater than the diameter $\varphi1$ of each of the connection terminals 5. That is, each of the connection terminals 5 is thinner than each of the external connection electrodes 7. The unusable space on the second main surface 22 of the mounting substrate 2 may be smaller than if the connection terminals 5 are thicker. The area of the external connection electrodes 7 may be large enough to provide a stable connection between the radio frequency module 1 and the external substrate.

The substrate 6 is thinner than the mounting substrate 2 in the thickness direction D1 of the mounting substrate 2. This enables a reduction in the profile of the radio-frequency module 1.

(3.8) First Resin Layer, Second Resin Layer, Third Resin Layer, and Shield Layer As illustrated in FIG. 1, the first resin layer 81 is disposed on the first main surface 21 of the mounting substrate 2. The first resin layer 81 covers the first electronic components 3. The first resin layer 81 covers peripheral surfaces 32 and main surfaces 33 of the first electronic components 3. The main surfaces 33 are farther than the other main surfaces of the first electronic components 3 from the mounting substrate 2. The first resin layer 81 is made of resin, such as an epoxy resin. The first resin layer 81 may be made of a mixture of resin and filler.

As illustrated in FIG. 1, the second resin layer 82 is disposed on the second main surface 22 of the mounting substrate 2. The second resin layer 82 covers the second electronic components 4 and the connection terminals 5. The second resin layer 82 covers a peripheral surface 45 and a main surface (a sixth main surface 42) of the second electronic component 4. The sixth main surface 42 is farther than the other main surface of the second electronic component 4 from the mounting substrate 2. The second resin layer 82 covers peripheral surfaces 53 of the connection terminals 5. The second resin layer 82 is made of resin, such as an epoxy resin. The second resin layer 82 may be made of a mixture of resin and filler. The second resin layer 82 and the first resin layer 81 may be made of the same material or may be made of different materials.

As illustrated in FIG. 1, the third resin layer 83 is disposed on the fourth main surface 62 of the substrate 6. The third resin layer 83 covers the external connection electrodes 7. The third resin layer 83 covers peripheral surfaces 73 of the external connection electrodes 7. The third resin layer 83 is made of resin, such as an epoxy resin. The third resin layer 83 may be made of a mixture of resin and filler. The third resin layer 83 and the first resin layer 81 may be made of the same material or may be made of different materials. The third resin layer 83 and the second resin layer 82 may be made of the same material or may be made of different materials.

As illustrated in FIG. 1, the shield layer 84 covers the first resin layer 81. The shield layer 84 is electrically conductive. The shield layer 84 of the radio-frequency module 1 is, for example, intended for providing electromagnetic shielding inside and outside the radio-frequency module 1. The shield layer 84 has a multilayer structure including metal layers stacked on top of each other. Alternatively, the shield layer 84 may be a single metal layer. Each metal layer may be made of one or more metals. The shield layer 84 covers a main surface 811 and a peripheral surface 812 of the first resin layer 81 and a peripheral surface 23 of the mounting substrate 2. The main surface 811 is farther than the other main surface of the first resin layer 81 from the mounting substrate 2. The shield layer 84 also covers a peripheral surface 821 of the second resin layer 82 and a peripheral surface 831 of the third resin layer 83. The shield layer 84 is in contact with at least part of a peripheral surface of the ground layer of the mounting substrate 2. Accordingly, the shield layer 84 and the ground layer are placed at the same potential.

(4) Details on Structure of Each Constituent Element of Radio-Frequency Module (4.1) Mounting Substrate The mounting substrate 2 illustrated in FIGS. 1 to 3 is a multilayer substrate including, for example, a plurality of dielectric layers and a plurality of electrically conductive layers. The dielectric layers and the electrically conductive layers are stacked in the thickness direction D1 of the mounting substrate 2. The electrically conductive layers are formed into the respective predetermined patterns. Each of the electrically conductive layers includes one or more conductor portions in a plane orthogonal to the thickness direction D1 of the mounting substrate 2. The electrically conductive layers are made of, for example, of copper. One of the electrically conductive layers is a ground layer. The mounting substrate 2 of the radio frequency module 1 includes, for example, via conductors that form an electrical connection between the ground layer and external ground terminals. The mounting substrate 2 is, for example, a low-temperature co-fired ceramic (LTCC) substrate. It is not required that the mounting substrate 2 be an LTCC substrate. The mounting substrate 2 may be a printed wiring board, a high-temperature co-fired ceramic (HTCC) substrate, or a resin multilayer substrate.

Alternatively, the mounting substrate 2 may be a wiring structure. The wiring structure is, for example, a multilayer structure. The multilayer structure includes at least one insulating layer and at least one electrically conductive layer. The at least one insulating layer is formed into a predetermined pattern. In a case that two or more insulating layers are included in the multilayer structure, the insulating layers are formed into the respective predetermined patterns. The at least one electrically conductive layer is formed into a predetermined pattern different from that of the at least one insulating layer. In a case that two or more electrically conductive layers are included in the multilayer structure, the electrically conductive layers are formed into the respective predetermined patterns. The at least one electrically conductive layer may include one or more redistribution portions. The wiring structure has two surfaces that are located on opposite sides in the thickness direction of the multilayer structure. One of the two surfaces is a first surface that is the equivalent of the first main surface 21 of the mounting substrate 2, and the other surface is a second surface that is the equivalent of the second main surface 22 of the mounting substrate 2. The wiring structure may be an interposer. The interposer that is used as the wiring structure may be a silicon substrate or a multilayer substrate.

The first main surface 21 and the second main surface 22 of the mounting substrate 2 are separate from each other in the thickness direction D1 of the mounting substrate 2 and each form an angle with the thickness direction D1 of the mounting substrate 2. The first main surface 21 of the mounting substrate 2 is, for example, orthogonal to the thickness direction D1 of the mounting substrate 2. Alternatively, the first main surface 21 may be a surface that is not orthogonal to the thickness direction D1; that is, the first main surface 21 may include, for example, side surfaces of the conductor portion(s). The second main surface 22 of the mounting substrate 2 is, for example, orthogonal to the thickness direction D1 of the mounting substrate 2. Alternatively, the second main surface 22 may be a surface that is not orthogonal to the thickness direction D1; that is, the second main surface 22 may include, for example, side surfaces of the conductor portion(s). The first main surface 21 and the second main surface 22 of the mounting substrate 2 may have fine irregularities, a recess, or a projection.

(4.2) Filters

The structure of the transmitting filters 121 to 123 and the receiving filters 131 to 133 illustrated in FIG. 4 is described below in detail. The transmitting filters 121 to 123 and the receiving filters 131 to 133 in the following description are simply referred to as filters without being distinguished from one another.

The filters are each in one-chip form. Series-arm resonators and parallel-arm resonators included in the filters are, for example, acoustic wave resonators. For example, the filters each include a substrate, a piezoelectric layer, and interdigital transducer (IDT) electrodes. The substrate has a first surface and a second surface. The piezoelectric layer is disposed on the first surface of the substrate. The piezoelectric layer is disposed on a low-acoustic-velocity film. The IDT electrodes are disposed on the piezoelectric layer. The low-acoustic-velocity film is disposed directly on the substrate or disposed over the substrate without direct contact with the substrate. The piezoelectric layer is disposed directly on the low-acoustic-velocity film or disposed over the low-acoustic-velocity film without direct contact with the low-acoustic-velocity film. The acoustic velocity of a bulk wave propagating through the low-acoustic-velocity film is lower than the velocity of an acoustic wave propagating through the piezoelectric layer. The acoustic velocity of a bulk wave propagating through the substrate is higher than the velocity of an acoustic wave propagating through the piezoelectric layer. The piezoelectric layer is made of, for example, lithium tantalate. The low-acoustic-velocity film is made of, for example, silicon oxide. The substrate is, for example, a silicon substrate. The piezoelectric layer has, for example, a thickness of $3.5\lambda$ or less, where $\lambda$ denotes the wavelength of the acoustic wave and is determined by the electrode-finger period of the IDT electrodes. The low-acoustic-velocity film has, for example, a thickness of $2.0\lambda$ or less.

The piezoelectric layer may, for example, be made of lithium tantalate, lithium niobate, zinc oxide, aluminum nitride, or PZT. The low-acoustic-velocity film may be made of at least one material selected from the group consisting of silicon oxide, glass, silicon oxynitride, tantalum oxide, a compound formed by adding fluorine to silicon oxide, a compound formed by adding carbon to silicon oxide, and a compound formed by adding boron to silicon oxide. The substrate may be made of at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

Each filter also includes, for example, a spacer layer and a cover member. The spacer layer and the cover member are disposed on the first surface of the substrate. The spacer layer surrounds the IDT electrodes when viewed in plan in the thickness direction of the substrate. The spacer layer is in the form of a frame (a rectangular frame) when viewed in plan in the thickness direction of the substrate. The spacer layer has electrical insulation properties. The spacer layer is made of, for example, synthetic resin, such as an epoxy resin or polyimide. The cover member is flat and plate-like in shape. The cover member is rectangular when viewed in plan in the thickness direction of the substrate. Alternatively, the cover member may, for example, be square when viewed in plan in the thickness direction. The outer shape of the cover member, the outer shape of the spacer layer, are substantially equal in size when the filter is viewed in plan in the thickness direction of the substrate. The cover member is disposed on the spacer layer and faces the substrate in the thickness direction of the substrate. The cover member overlaps the IDT electrodes when viewed in the thickness direction of the substrate. The cover member is located away from the IDT electrodes in the thickness direction of the substrate. The cover member has electrical insulation properties. The cover member is made of, for example, synthetic resin, such as an epoxy resin or polyimide. The filter includes a space defined by the substrate, the spacer layer, and the cover member. The space in the filter is filled with gas. The gas in the space is, for example, air or an inert gas, such as a nitrogen gas. The terminals are exposed at a surface of the cover member. The terminals are, for example, bumps. The bumps are, for example, solder bumps. Alternatively, the bumps may, for example, be Au bumps.

Each filter may, for example, include an adhesive layer disposed between the low-acoustic-velocity film and the piezoelectric layer. The adhesive layer is made of, for example, resin such as an epoxy resin or a polyimide resin. Each filter may also include a dielectric film disposed between the low-acoustic-velocity film and the piezoelectric layer, a dielectric film disposed on the piezoelectric layer, or a dielectric film disposed under the low-acoustic-velocity film.

Each filter may, for example, include a high-acoustic-velocity film disposed between the substrate and the low-acoustic-velocity film. The high-acoustic-velocity film is disposed directly on the substrate or disposed over the substrate without direct contact with the substrate. The low-acoustic-velocity film is disposed directly on the high-acoustic-velocity film or disposed over the high-acoustic-velocity film without direct contact with the high-acoustic-velocity film. The piezoelectric layer is disposed directly on the low-acoustic-velocity film or disposed over the low-acoustic-velocity film without direct contact with the low-acoustic-velocity film. The acoustic velocity of a bulk wave propagating through the high-acoustic-velocity film is higher than the velocity of an acoustic wave propagating through the piezoelectric layer. The acoustic velocity of a bulk wave propagating through the low-acoustic-velocity film is lower than the velocity of an acoustic wave propagating through the piezoelectric layer.

Examples of the material of the high-acoustic-velocity film include: piezoelectric materials such as diamond-like carbon, aluminum nitride, aluminum oxide, silicon carbide, silicon nitride, silicon, sapphire, lithium tantalate, lithium niobate, and quartz; various ceramics such as alumina, zirconia, cordierite, mullite, steatite, and forsterite; magnesia; diamond; materials containing any of the above materials as a principal component; and materials containing a mixture of the above materials as a principal component.

In the presence of the high-acoustic-velocity film, acoustic waves are trapped in the piezoelectric layer and the low-acoustic-velocity film. Thus, thicker high-acoustic-velocity films are more desirable. Each filter that exhibits piezoelectricity may include, in addition to the high-acoustic-velocity film, the low-acoustic-velocity film, and the piezoelectric layer, films such as an adhesive layer and a dielectric film.

It is not required that the series-arm resonators and the parallel-arm resonators be acoustic wave resonators. The series-arm resonators and the parallel-arm resonators may be SAW resonators or bulk acoustic wave (BAW) resonators. The SAW resonators each include, for example, a piezoelectric substrate and IDT electrodes disposed on the piezoelectric substrate. When the series-arm resonators and the parallel-arm resonators included in each filter are SAW resonators, IDT electrodes provided for the respective series-arm resonators and IDT electrodes provided for the respective parallel-arm resonators are disposed on one piezoelectric substrate. The piezoelectric substrate is, for example, a lithium tantalate substrate or a lithium niobate substrate.

(4.3) Power Amplifier

The power amplifier 11 illustrated in FIG. 4 is, for example, an IC in one-chip form and includes a substrate and an amplification functional part. The substrate has a first main surface and a second main surface on opposite sides. The substrate is, for example, a gallium arsenide substrate. The amplification functional part includes at least one transistor on the first surface of the substrate. The amplification functional part is capable of amplifying transmission signals in a predetermined frequency band. The transistor is, for example, a heterojunction bipolar transistor (HBT). Power supply voltage from a power supply circuit (not illustrated) is applied between the collector and the emitter of the HBT of the power amplifier 11. The power amplifier 11 may include, in addition to the amplification functional part, a direct-current cutting capacitor. The power amplifier 11 is mounted on the first main surface 21 of the mounting substrate 2 by flip-chip mounting in such a manner that the first surface of the substrate of the power amplifier 11 faces the first main surface 21 of the mounting substrate 2. The outer shape of the power amplifier 11 viewed in plan in the thickness direction D1 of the mounting substrate 2 is quadrilateral.

(4.4) Low-Noise Amplifier

The low-noise amplifier 14 illustrated in FIG. 4 is, for example, an IC component including a substrate and an amplification functional part. The substrate has a first main surface and a second main surface on opposite sides. The substrate is, for example, a silicon substrate. The amplification functional part is provided on the first surface of the substrate. The amplification functional part is capable of amplifying reception signals in a predetermined frequency band. The low-noise amplifier 14 is mounted on the second main surface 22 of the mounting substrate 2 by flip-chip mounting in such a manner that the first surface of the substrate of the low-noise amplifier 14 faces the second main surface 22 of the mounting substrate 2.

(4.5) Substrate

The substrate 6 illustrated in FIG. 1 is a multilayer substrate including, for example, a plurality of dielectric layers and a plurality of electrically conductive layers. The dielectric layers and the electrically conductive layers are stacked in the thickness direction of the substrate 6, that is, in the thickness direction D1 of the mounting substrate 2. The electrically conductive layers are formed into the respective predetermined patterns. Each of the electrically conductive layers includes one or more conductor portions in a plane orthogonal to the thickness direction of the substrate 6. The electrically conductive layers is made of, for example, copper. One of the electrically conductive layers is a ground layer. The substrate 6 of the radio frequency module 1 includes, for example, via conductors that form an electrical connection between the ground layer and external ground terminals. The substrate 6 is, for example, a low-temperature co-fired ceramic (LTCC) substrate. It is not required that the substrate 6 be an LTCC substrate. The substrate 6 may be a printed wiring board, a high-temperature co-fired ceramic (HTCC) substrate, or a resin multilayer substrate.

Alternatively, the substrate 6 may be a wiring structure. The wiring structure is, for example, a multilayer structure. The multilayer structure includes at least one insulating layer and at least one electrically conductive layer. The at least one insulating layer is formed into a predetermined pattern. In a case that two or more insulating layers are included in the multilayer structure, the insulating layers are formed into the respective predetermined patterns. The at least one electrically conductive layer is formed into a predetermined pattern different from that of the at least one insulating layer. In a case that two or more electrically conductive layers are included in the multilayer structure, the electrically conductive layers are formed into the respective predetermined patterns. The at least one electrically conductive layer may include one or more redistribution portions. The wiring structure has two surfaces that are located on opposite sides in the thickness direction of the multilayer structure. One of the two surfaces is a first surface that is the equivalent of the third main surface 61 of the substrate 6, and the other surface is a second surface that is the equivalent of the fourth main surface 62 of the substrate 6. The wiring structure may be an interposer. The interposer that is used as the wiring structure may be a silicon substrate or a multilayer substrate.

The third main surface 61 and the fourth main surface 62 of the substrate 6 are separate from each other in the thickness direction of the substrate 6 and each form an angle with the thickness direction of the substrate 6. The third main surface 61 of the substrate 6 is, for example, orthogonal to the thickness direction of the substrate 6. Alternatively, the third main surface 61 may be a surface that is not orthogonal to the thickness direction; that is, the third main surface 61 may include, for example, side surfaces of the conductor portion(s). The fourth main surface 62 of the substrate 6 is, for example, orthogonal to the thickness direction of the substrate 6. Alternatively, the fourth main surface 62 may be a surface that is not orthogonal to the thickness direction; that is, the fourth main surface 62 may include, for example, side surfaces of the conductor portion(s). The third main surface 61 and the fourth main surface 62 of the substrate 6 may have fine irregularities, a recess, or a projection.

(5) Communication Device

As illustrated in FIG. 4, the communication device 9 includes the radio frequency module 1, the antenna 91, and the signal processing circuit 92.

(5.1) Antenna

The antenna 91 is connected to the antenna terminal 101 of the radio frequency module 1. The antenna 91 enables the radio frequency module 1 to transmit and receive signals; that is, a transmission signal from the radio frequency module 1 is converted into a radio wave and is then emitted through the antenna 91, and a reception signal received in the form of a radio wave from the outside enters the radio-frequency module 1 through the antenna 91.

(5.2) Signal Processing Circuit

The signal processing circuit 92 includes the RF signal processing circuit 93 and a baseband signal processing circuit 94. The signal processing circuit 92 processes signals flowing through the radio frequency module 1. More specifically, the signal processing circuit 92 processes transmission signals and reception signals.

The RF signal processing circuit 93 is, for example, a radio frequency integrated circuit (RFIC) and processes radio frequency signals.

The RF signal processing circuit 93 performs signal processing such as up-conversion on radio frequency signals output by the baseband signal processing circuit 94 and outputs the resultant radio frequency signals to the radio-frequency module 1. Specifically, the RF signal processing circuit 93 performs signal processing such as up-conversion on transmission signals output by the baseband signal processing circuit 94 and outputs the resultant transmission signals to the transmission paths in the radio frequency module 1.

The RF signal processing circuit 93 also performs signal processing such as down-conversion on radio frequency signals output by the radio frequency module 1 and outputs the resultant radio frequency signals to the baseband signal processing circuit 94. Specifically, the RF signal processing circuit 93 performs signal processing on reception signals output by the radio frequency module 1 and outputs the resultant reception signals to the baseband signal processing circuit 94.

The baseband signal processing circuit 94 is, for example, a baseband integrated circuit (BBIC) and performs, for example, certain signal processing on transmission signals received from outside the signal processing circuit 92. The signals processed by the baseband signal processing circuit 94 are used, for example, as image signals for displaying an image or as audio signals for a telephone conversation.

The RF signal processing circuit 93 also functions as a control unit that controls, in accordance with the communication band (frequency band) in use, connections in the first switch 17, the second switch 18, and the third switch 19 included in the radio frequency module 1. Specifically, the RF signal processing circuit 93 performs, by using control signals (not illustrated), switching between connections in the first switch 17, the second switch 18, and the third switch 19 included in the radio-frequency module 1. The control unit may be disposed outside the RF signal processing circuit 93. For example, the control unit may be disposed, for example, in the radio-frequency module 1 or the baseband signal processing circuit 94.

(6) Exemplary Effects

At least one external connection electrode 7A included in the external connection electrodes 7 of the radio-frequency module 1 according to Embodiment 1 is disposed in the region A1 on the fourth main surface 62 of the substrate 6. The region A1 overlaps at least the second electronic component 4 when viewed in plan in the thickness direction D1 of the mounting substrate 2. That is, at least one external connection electrodes 7A included in the external connection electrodes 7 overlaps the second electronic component 4 when viewed in plan in the thickness direction D1 of the mounting substrate 2. The radio frequency module 1 can thus include a greater number of terminals (external connection electrodes 7) for connection to the outside.

The external connection electrodes 7 are greater in number than the connection terminals 5; therefore, the radio frequency module 1 according to exemplary Embodiment 1 can include a greater number of external connection electrodes 7 for connection to the external substrate (not illustrated).

The diameter φ1 of each of the connection terminals 5 of the radio frequency module 1 according to exemplary Embodiment 1 is not equal to the diameter φ2 of each of the external connection electrodes 7 of the radio frequency module 1. Accordingly, the degree of flexibility in the design of the radio frequency module 1 is increased.

The diameter φ2 of each of the external connection electrodes 7 is greater than the diameter of φ1 of the connection terminals 5; therefore, the radio frequency module 1 according to exemplary Embodiment 1 can be connected to the external substrate (not illustrated) with a higher degree of stability.

The substrate 6 of the radio frequency module 1 according to exemplary Embodiment 1 is thinner than the mounting substrate 2 of the radio frequency module 1. This enables a reduction in the profile of the radio frequency module 1.

Embodiment 2

Figure 5:
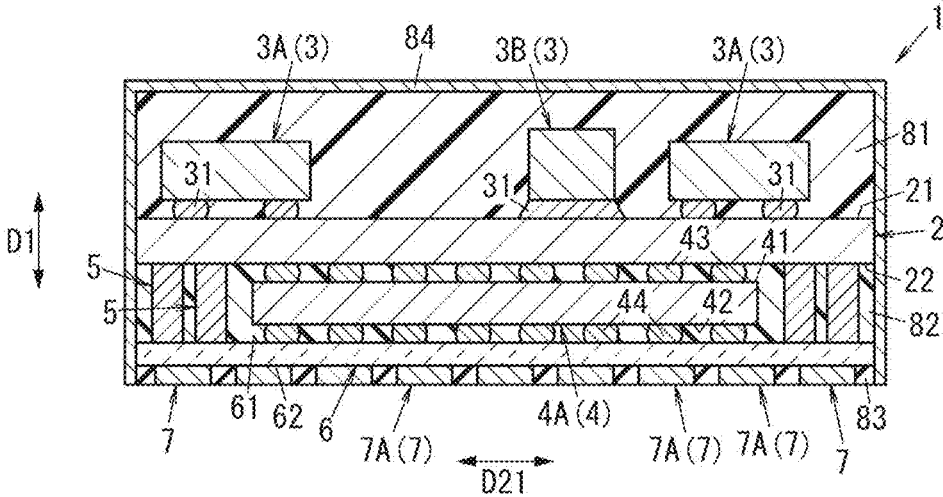
FIG. 5 is a sectional view of a radio frequency module according to exemplary Embodiment 2.

As illustrated in FIG. 5, a radio frequency module 1 according to exemplary Embodiment 2 differs from the radio-frequency module 1 according to exemplary Embodiment 1 (see FIG. 1) in that the second electronic component 4 as well as the connection terminals 5 is connected to the external connection electrodes 7 by the substrate 6.
(1) Configuration Referring to FIG. 5, the radio frequency module 1 according to exemplary Embodiment 2 includes a mounting substrate 2, first electronic components 3, a second electronic component 4, connection terminals 5, a substrate 6, and external connection electrodes 7. Constituent elements of the radio frequency module 1 according to exemplary Embodiment 2 that are similar to the corresponding constituent elements of the radio frequency module 1 according to Embodiment 1 are denoted by the same reference signs, and redundant description thereof will be omitted.

As with the second electronic component 4 in exemplary Embodiment 1 (see FIG. 1), the second electronic component 4 in exemplary Embodiment 2 has a fifth main surface 41 and a sixth main surface 42. The fifth main surface 41 and the sixth main surface 42 are located on opposite sides in the thickness direction D1 of the mounting substrate 2. The second electronic component 4 is mounted on the mounting substrate 2 with bumps 43 interposed therebetween. The bumps 43 are electrically conductive. The second electronic component 4 in exemplary Embodiment 2 may have configurations and functions similar to those of the second electronic component 4 in exemplary Embodiment 1, and redundant description thereof will be omitted.

The second electronic component 4 in exemplary Embodiment 2 is also mounted on the substrate 6 with bumps 44 interposed therebetween. The bumps 44 are electrically conductive. More specifically, the second electronic component 4 is mounted on the substrate 6 in such a manner that the sixth main surface 42 faces the third main surface 61 of the substrate 6.

The substrate 6 in exemplary Embodiment 2 connects the second electronic component 4 as well as the connection terminals 5 to the external connection electrodes 7. The third main surface 61 of the substrate 6 is connected with the second electronic component 4 with the bumps 44 interposed therebetween and is in contact with the connection terminals 5. The fourth main surface 62 of the substrate 6 is a mounting place for the external connection electrodes 7. The substrate 6 in Embodiment 2 may have configurations and functions similar to those of the substrate 6 in Embodiment 1 (see FIG. 1), and redundant description thereof will be omitted.
(2) Exemplary Effects The radio frequency module 1 according to Embodiment 2 is similar to the radio frequency module 1 according to exemplary Embodiment 1 in the following respects: at least one external connection electrode 7A included in the external connection electrodes 7 is disposed in the region A1 (see FIG. 3) on the fourth main surface 62 of the substrate 6, and the region A1 overlaps at least the second electronic component 4 when viewed in plan in the thickness direction D1 of the mounting substrate 2. The radio-frequency module 1 can thus include a greater number of external connection electrodes 7 for connection to the external substrate (not illustrated).

Embodiment 3

Figure 6:
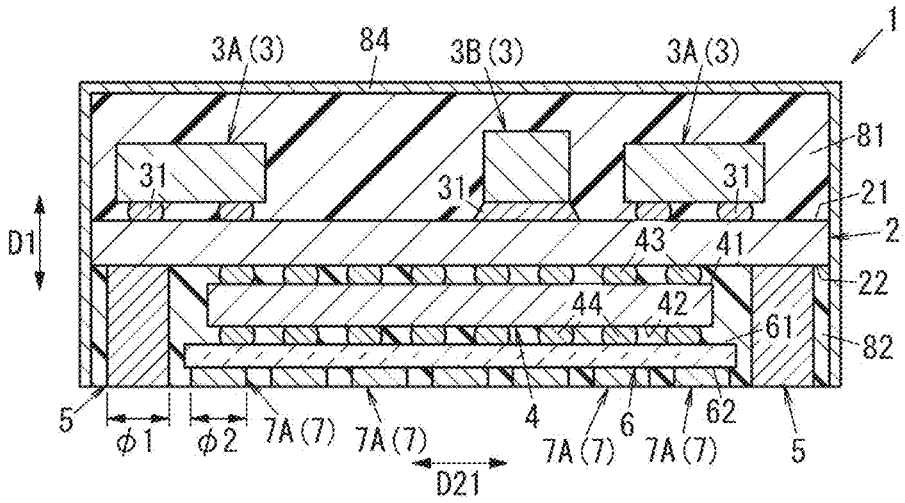
FIG. 6 is a sectional view of a radio frequency module according to exemplary Embodiment 3.

As illustrated in FIG. 6, a radio frequency module 1 according to exemplary Embodiment 3 differs from the radio-frequency module 1 according to exemplary Embodiment 2 (see FIG. 5) in that the connection terminals 5 are connectable to the external substrate (not illustrated).
(1) Configuration Referring to FIG. 6, the radio frequency module 1 according to exemplary Embodiment 3 includes a mounting substrate 2, first electronic components 3, a second electronic component 4, connection terminals 5, a substrate 6, and external connection electrodes 7. Constituent elements of the radio frequency module 1 according to exemplary Embodiment 3 that are similar to the corresponding constituent elements of the radio frequency module 1 according to exemplary Embodiment 2 are denoted by the same reference signs, and redundant description thereof will be omitted.

The substrate 6 in exemplary Embodiment 3 is smaller than the mounting substrate 2 when viewed in plan in the thickness direction D1 of the mounting substrate 2. More specifically, the substrate 6 extends over only part of the mounting substrate 2 when viewed in plan in the thickness direction D1 of the mounting substrate 2. The substrate 6 overlaps the second electronic component 4 when viewed in plan in the thickness direction D1 of the mounting substrate 2. The substrate 6 does not overlap the connection terminals 5 when viewed in plan in the thickness direction D1 of the mounting substrate 2. The substrate 6 in exemplary Embodiment 3 may have configurations and functions similar to those of the substrate 6 in exemplary Embodiment 2 (see FIG. 5), and redundant description thereof will be omitted.

The connection terminals 5 in exemplary Embodiment 3 are connectable to the external substrate (not illustrated). The connection terminals 5 are not connected to the substrate 6. The connection terminals 5 in exemplary Embodiment 3 may have configurations and functions similar to those of the connection terminals 5 in exemplary Embodiment 2 (see FIG. 5), and redundant description thereof will be omitted.

In exemplary Embodiment 3, the diameter of each of the connection terminals 5 is greater than the diameter of each of the external connection electrodes 7 ($\varphi1 > \varphi2$). Specifically, $\varphi1$ denotes the diameter of each of the connection terminals 5 viewed in plan in the thickness direction D1 of the mounting substrate 2, and $\varphi2$ denotes the diameter of each of the external connection electrodes 7 viewed in plan in the thickness direction D1 of the mounting substrate 2.
(2) Exemplary Effects The diameter $\varphi1$ of each of the connection terminals 5 of the radio frequency module 1 according to Embodiment 3 is greater than the diameter of $\varphi2$ of the external connection electrodes 7 of the radio frequency module 1. This feature yields an improvement in thermal dissipation and a reduction in electrical resistance.
(3) Modifications It is not required in modifications of exemplary Embodiment 3 that the diameter $\varphi1$ of all of the connection terminals 5 is greater than the diameter $\varphi2$ of each of the external connection electrodes 7. The diameter $\varphi1$ of only some of the connection terminals 5 may be greater than the diameter $\varphi2$ of each of the external connection electrodes 7. The diameter $\varphi1$ of the other connection terminals 5 may be equal to or less than the diameter $\varphi2$ of each of the external connection electrodes 7.

The radio frequency module 1 in any of these modifications produces effects similar to the effects of the radio frequency module 1 according to exemplary Embodiment 3.

Embodiment 4

Figure 8:
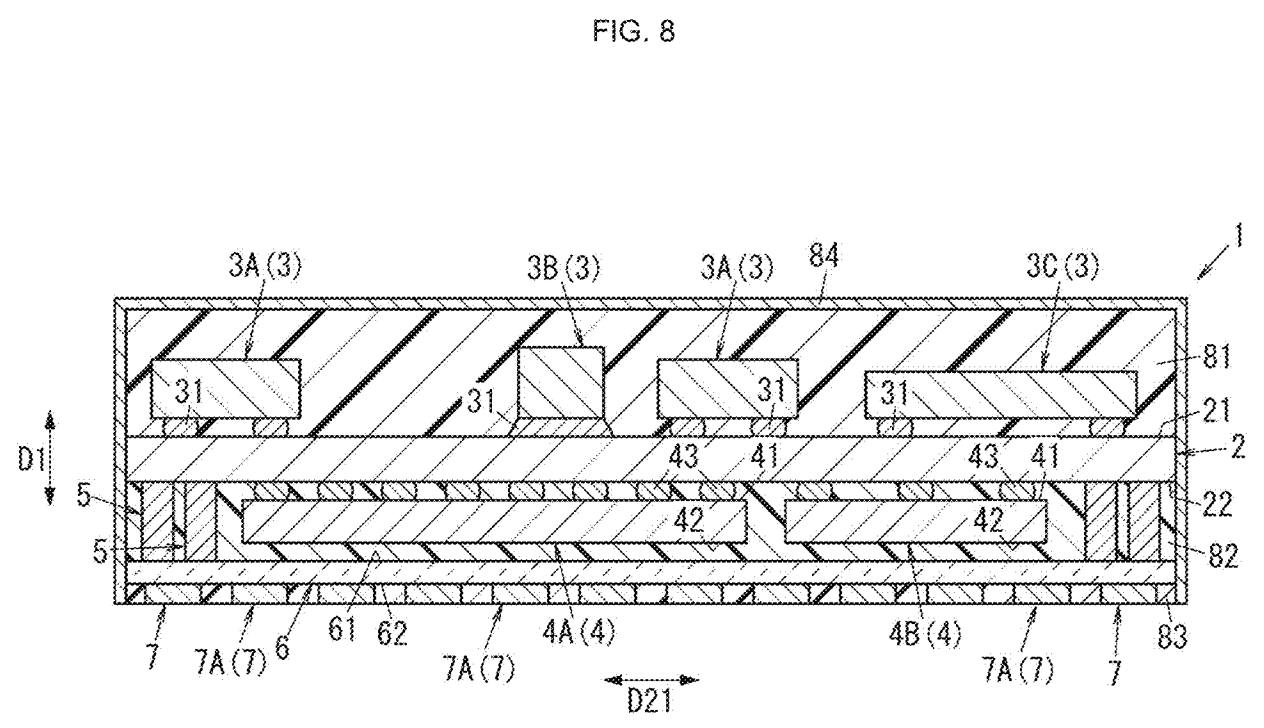

As illustrated in FIG. 8, a radio frequency module 1 according to exemplary Embodiment 4 differs from the radio-frequency module 1 according to exemplary Embodiment 1 (see FIG. 1) in that more than one second electronic component 4 is disposed on the second main surface 22 of the mounting substrate 2.

(1) Configuration

Figure 7:
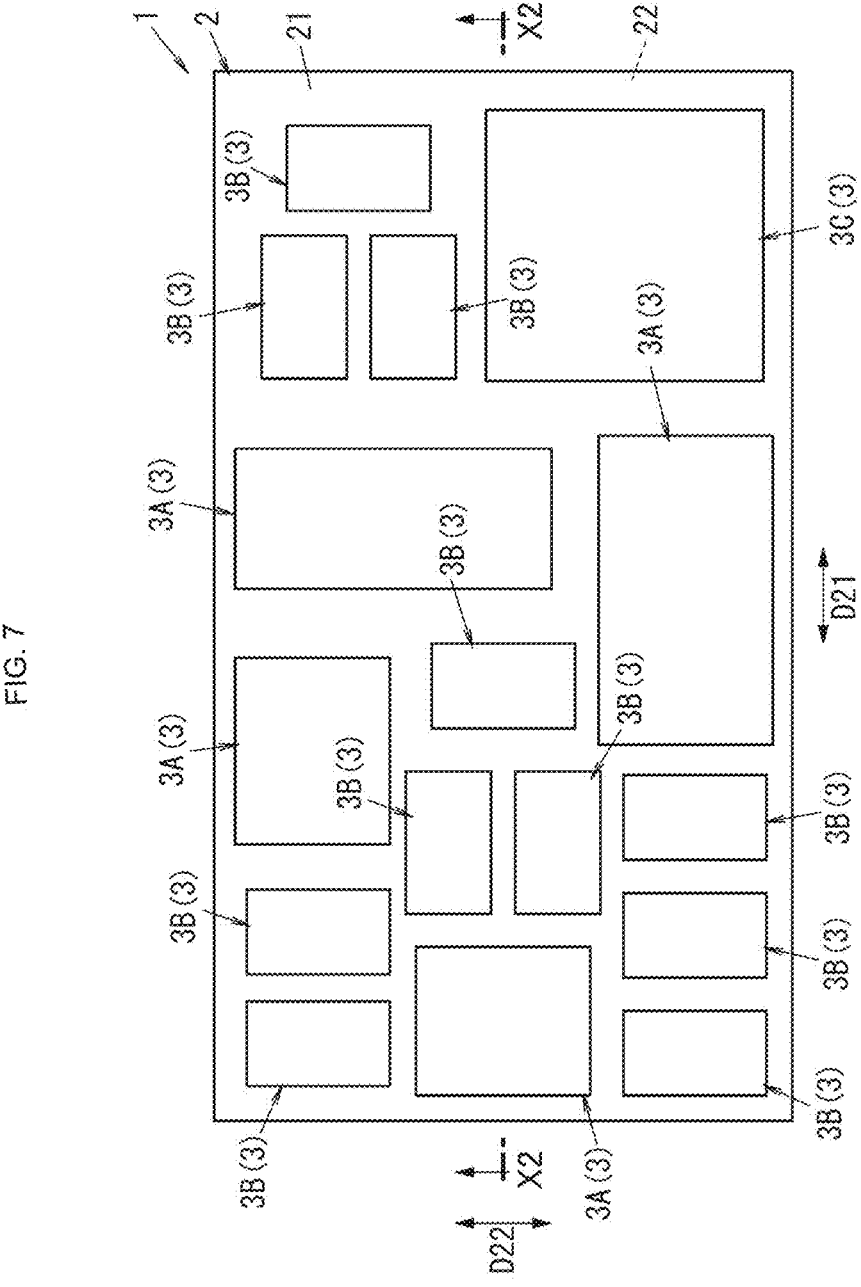
FIG. 7 is a plan view of a radio frequency module according to exemplary Embodiment 4.

Referring to FIGS. 7 and 8, the radio frequency module 1 according to exemplary Embodiment 4 includes a mounting substrate 2, first electronic components 3 (3A to 3C), substrate 6, and external connection electrodes 7. Constituent elements of the radio frequency module 1 according to exemplary Embodiment 4 that are similar to the corresponding constituent elements of the radio frequency module 1 according to exemplary Embodiment 1 are denoted by the same reference signs, and redundant description thereof will be omitted. FIG. 8 is a sectional view taken along line X2-X2 in FIG. 7. The first resin layer 81 and the shield layer 84 are not illustrated in FIG. 7.

As with the second electronic component 4 in exemplary Embodiment 1 (see FIG. 1), the second electronic components 4 in exemplary Embodiment 4 each have the fifth main surface 41 and the sixth main surface 42. The fifth main surface 41 and the sixth main surface 42 of each of the second electronic component 4 are located on opposite sides in the thickness direction D1 of the mounting substrate 2. Each of the second electronic components 4 is mounted on the mounting substrate 2 with the bumps 43 interposed therebetween. The second electronic components 4 in exemplary Embodiment 4 may have configurations and functions similar to those of the second electronic component 4 in exemplary Embodiment 1, and redundant description thereof will be omitted.

The second electronic components 4 include a second electronic component 4A and a second electronic component 4B. The second electronic component 4A includes the low-noise amplifier 14 (see FIG. 4). The second electronic component 4B includes the first switch 17 (see FIG. 4), the second switch 18 (see FIG. 4), and the third switch 19 (see FIG. 4).

(2) Exemplary Effects

The radio frequency module 1 according to exemplary Embodiment 4 is similar to the radio frequency module 1 according to exemplary Embodiment 1 in the following respects: at least one external connection electrode 7A included in the external connection electrodes 7 is disposed in the region A1 (see FIG. 3) on the fourth main surface 62 of the substrate 6, and the region A1 overlaps at least the second electronic components 4 when viewed in plan in the thickness direction D1 of the mounting substrate 2. The radio frequency module 1 can thus include a greater number of external connection electrodes 7 for connection to the external substrate (not illustrated).

Embodiment 5

Figure 9:
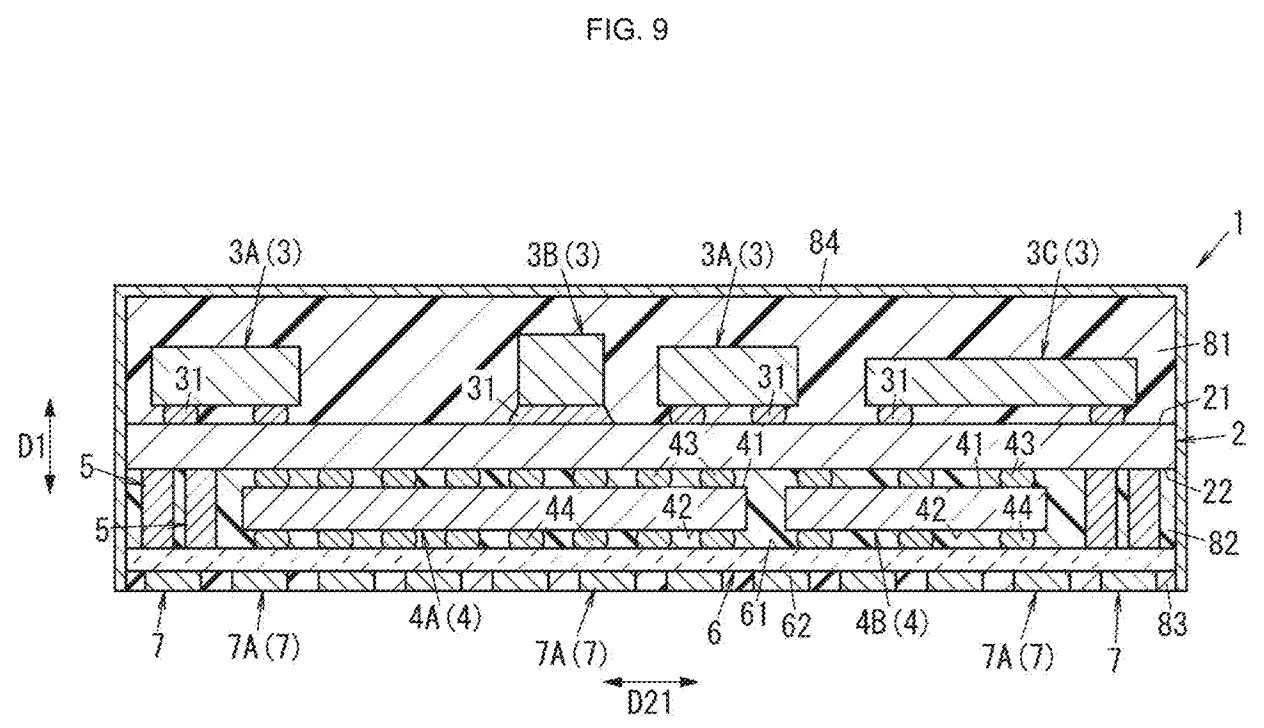

As illustrated in FIG. 9, a radio frequency module 1 according to exemplary Embodiment 5 differs from the radio-frequency module 1 according to exemplary Embodiment 4 (see FIG. 8) in that the second electronic components 4 as well as the connection terminals 5 are connected to the external connection electrodes 7 by the substrate 6.

(1) Configuration

Referring to FIG. 9, the radio frequency module 1 according to exemplary Embodiment 5 includes a mounting substrate 2, first electronic components 3 (3A to 3C), second electronic components 4, connection terminals 5, a substrate 6, and external connection electrodes 7. Constituent elements of the radio frequency module 1 according to exemplary Embodiment 5 that are similar to the corresponding constituent elements of the radio frequency module 1 according to exemplary Embodiment 4 are denoted by the same reference signs, and redundant description thereof will be omitted.

Each of the second electronic components 4 in exemplary Embodiment 5 is mounted on the substrate 6 with the bumps 44 interposed therebetween. More specifically, the second electronic components 4 are each mounted on the substrate 6 in such a manner that the sixth main surface 42 faces the third main surface 61 of the substrate 6. The second electronic components 4 in exemplary Embodiment 5 may have configurations and functions similar to those of the second electronic component 4 in exemplary Embodiment 4 (see FIG. 8), and redundant description thereof will be omitted.

(2) Exemplary Effects

The radio frequency module 1 according to exemplary Embodiment 5 is similar to the radio frequency module 1 according to exemplary Embodiment 1 in the following respects: at least one external connection electrode 7A included in the external connection electrodes 7 is disposed in the region A1 (see FIG. 3) on the fourth main surface 62 of the substrate 6, and the region A1 overlaps at least the second electronic components 4 when viewed in plan in the thickness direction D1 of the mounting substrate 2. The radio frequency module 1 can thus include a greater number of external connection electrodes 7 for connection to the external substrate (not illustrated).

Embodiment 6

Figure 10:
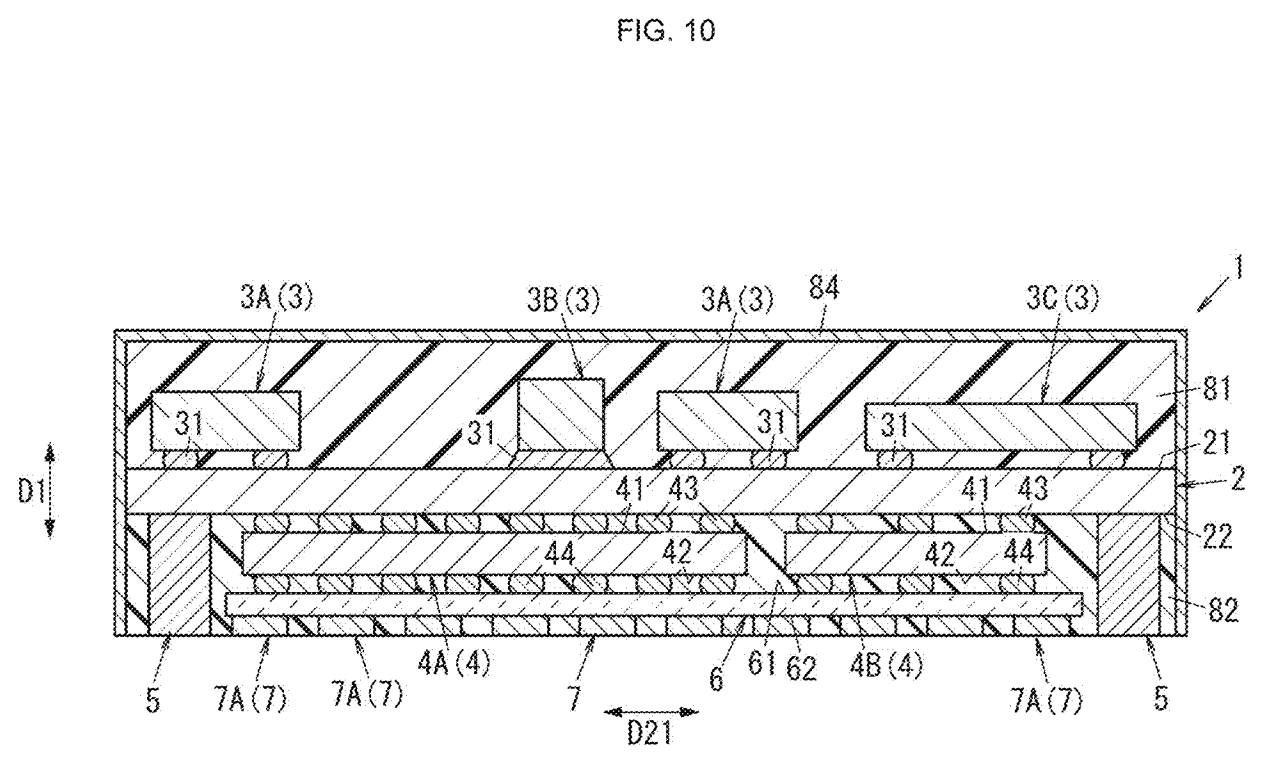

As illustrated in FIG. 10, a radio frequency module 1 according to exemplary Embodiment 6 differs from the radio-frequency module 1 according to exemplary Embodiment 5 (see FIG. 9) in that the connection terminals 5 are connectable to the external substrate (not illustrated).

(1) Configuration

Referring to FIG. 10, the radio frequency module 1 according to exemplary Embodiment 6 includes a mounting substrate 2, first electronic components 3 (3A to 3C), substrate 6, and external connection electrodes 7. Constituent elements of the radio frequency module 1 according to exemplary Embodiment 6 that are similar to the corresponding constituent elements of the radio frequency module 1 according to exemplary Embodiment 5 are denoted by the same reference signs, and redundant description thereof will be omitted.

The substrate 6 in exemplary Embodiment 6 is smaller than the mounting substrate 2 when viewed in plan in the thickness direction D1 of the mounting substrate 2. More specifically, the substrate 6 extends over only part of the mounting substrate 2 when viewed in plan in the thickness direction D1 of the mounting substrate 2. The substrate 6 overlaps the second electronic components 4 when viewed in plan in the thickness direction D1 of the mounting substrate 2. The substrate 6 does not overlap the connection terminals 5 when viewed in plan in the thickness direction D1 of the mounting substrate 2. The substrate 6 in exemplary Embodiment 6 may have configurations and functions similar to those of the substrate 6 in exemplary Embodiment 5 (see FIG. 9), and redundant description thereof will be omitted.

The connection terminals 5 in exemplary Embodiment 6 are connectable to the external substrate (not illustrated). The connection terminals 5 are not connected to the substrate 6. The connection terminals 5 in exemplary Embodiment 6 may have configurations and functions similar to those of the connection terminals 5 in exemplary Embodiment 5 (see FIG. 9), and redundant description thereof will be omitted.

(2) Exemplary Effects

The radio frequency module 1 according to exemplary Embodiment 6 is similar to the radio frequency module 1 according to exemplary Embodiment 1 in the following respects: at least one external connection electrode 7A included in the external connection electrodes 7 is disposed in the region A1 (see FIG. 3) on the fourth main surface 62 of the substrate 6, and the region A1 overlaps at least the second electronic components 4 when viewed in plan in the thickness direction D1 of the mounting substrate 2. The radio frequency module 1 can thus include a greater number of external connection electrodes 7 for connection to the external substrate (not illustrated).

Embodiment 7

Figure 11:
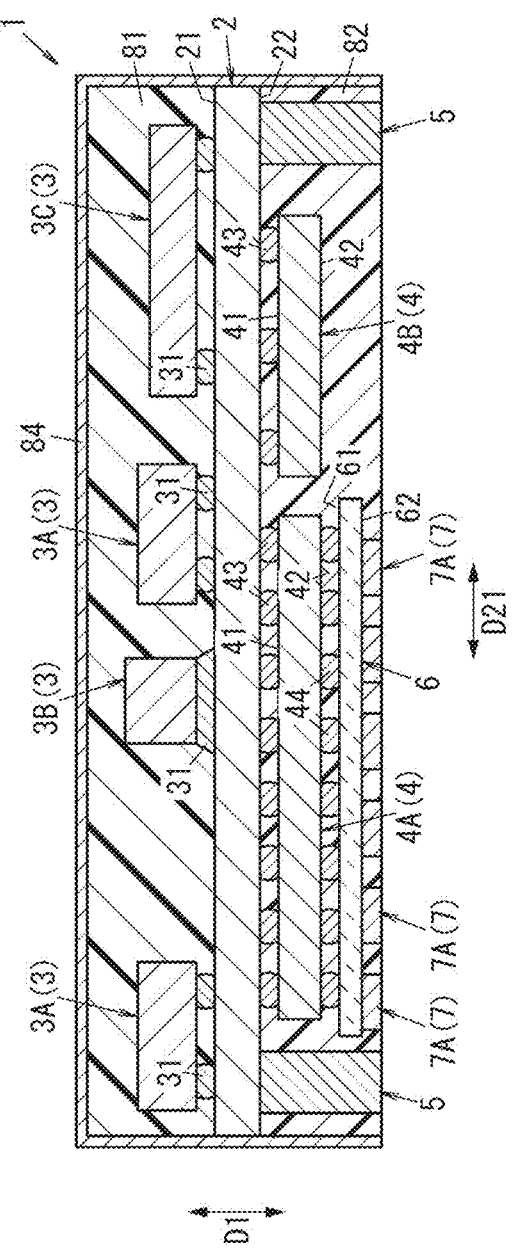
FIG. 11 is a sectional view of a radio frequency module according to exemplary Embodiment 7.

As illustrated in FIG. 11, a radio frequency module 1 according to exemplary Embodiment 7 differs from the radio-frequency module 1 according to exemplary Embodiment 6 (see FIG. 10) in that the substrate 6 does not overlap all of the second electronic components 4.

(1) Configuration

Referring to FIG. 11, the radio frequency module 1 according to exemplary Embodiment 7 includes a mounting substrate 2, first electronic components 3 (3A to 3C), second electronic components 4, connection terminals 5, a substrate 6, and external connection electrodes 7. Constituent elements of the radio frequency module 1 according to exemplary Embodiment 7 that are similar to the corresponding constituent elements of the radio frequency module 1 according to exemplary Embodiment 6 are denoted by the same reference signs, and redundant description thereof will be omitted.

The substrate 6 in exemplary Embodiment 7 overlaps the second electronic component 4A when viewed in plan in the thickness direction D1 of the mounting substrate 2. The second electronic component 4A is mounted on the substrate 6 with the bumps 44 interposed therebetween. The second electronic component 4A includes, for example, through-via electrodes (not illustrated). The substrate 6 does not overlap the second electronic component 4B when viewed in plan in the thickness direction D1 of the mounting substrate 2. The substrate 6 in exemplary Embodiment 7 may have configurations and functions similar to those of the substrate 6 in exemplary Embodiment 6 (see FIG. 10), and redundant description thereof will be omitted.

(2) Exemplary Effects

The radio frequency module 1 according to exemplary Embodiment 7 is similar to the radio frequency module 1 according to exemplary Embodiment 1 in the following respects: at least one external connection electrode 7A included in the external connection electrodes 7 is disposed in the region A1 (see FIG. 3) on the fourth main surface 62 of the substrate 6, and the region A1 overlaps at least one of the second electronic components 4 when viewed in plan in the thickness direction D1 of the mounting substrate 2. The radio frequency module 1 can thus include a greater number of external connection electrodes 7 for connection to the external substrate (not illustrated).

Embodiment 8

Figure 12:
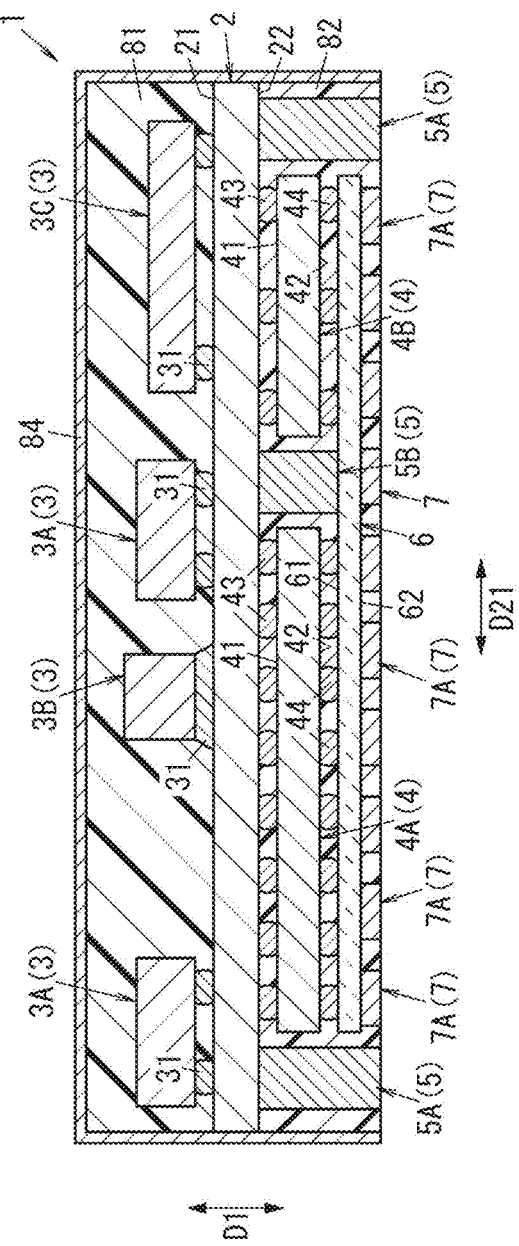
FIG. 12 is a sectional view of a radio frequency module according to exemplary Embodiment 8.

As illustrated in FIG. 12, a radio frequency module 1 according to exemplary Embodiment 8 differs from the radio-frequency module 1 according to exemplary Embodiment 6 (see FIG. 10) in that a connection terminal 5B is disposed between the second electronic components 4.

(1) Configuration

Referring to FIG. 12, the radio frequency module 1 according to exemplary Embodiment 8 includes a mounting substrate 2, first electronic components 3 (3A to 3C), second electronic components 4, connection terminals 5, a substrate 6, and external connection electrodes 7. Constituent elements of the radio frequency module 1 according to exemplary Embodiment 8 that are similar to the corresponding constituent elements of the radio frequency module 1 according to exemplary Embodiment 6 are denoted by the same reference signs, and redundant description thereof will be omitted.

The connection terminals 5 in exemplary Embodiment 8 include connection terminals 5A and a connection terminal 5B. The connection terminals 5A are not connected to the substrate 6 and are connectable to the external substrate (not illustrated). The connection terminal 5B forms a connection between the mounting substrate 2 and the substrate 6 and is disposed between the second electronic component 4A and the second electronic component 4B.

(2) Exemplary Effects

The radio frequency module 1 according to exemplary Embodiment 8 is similar to the radio frequency module 1 according to exemplary Embodiment 1 in the following respects: at least one external connection electrode 7A included in the external connection electrodes 7 is disposed in the region A1 (see FIG. 3) on the fourth main surface 62 of the substrate 6, and the region A1 overlaps at least the second electronic components 4 when viewed in plan in the thickness direction D1 of the mounting substrate 2. The radio frequency module 1 can thus include a greater number of external connection electrodes 7 for connection to the external substrate (not illustrated).

Embodiment 9

Figure 13:
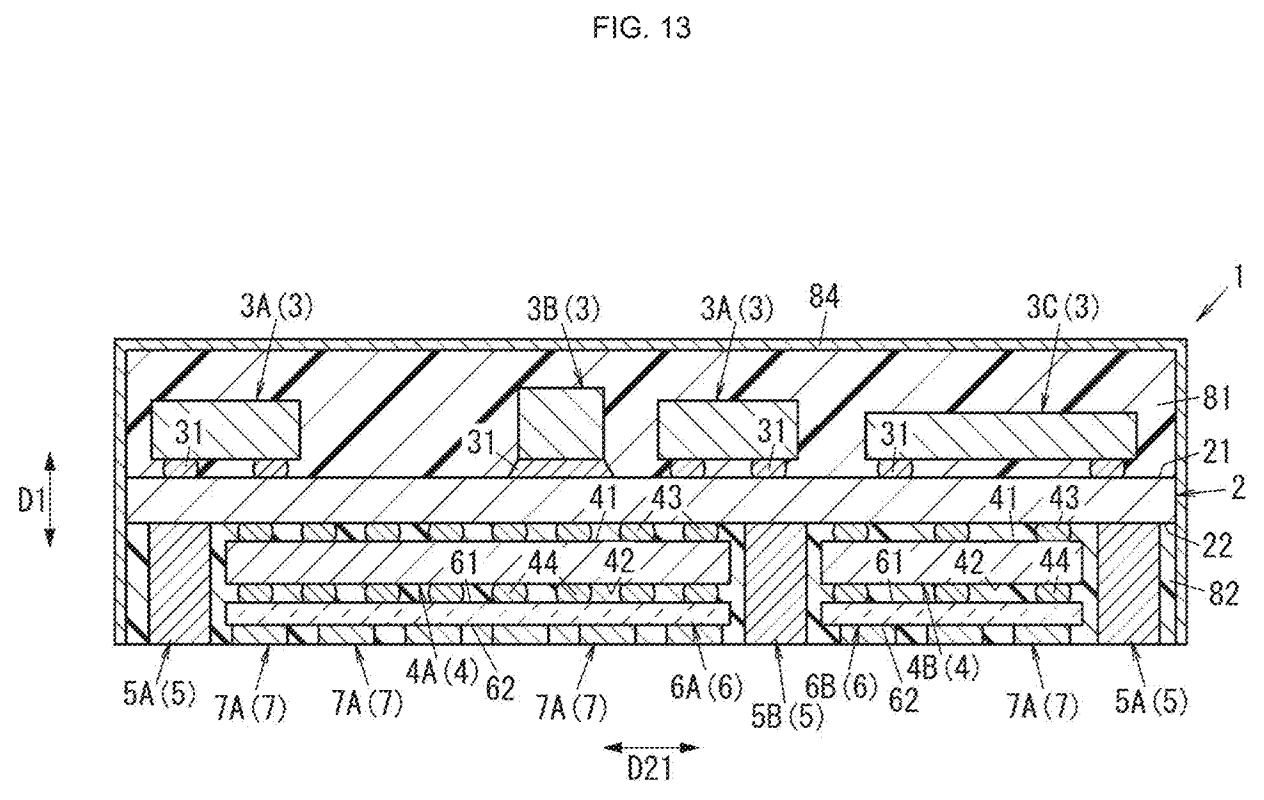

As illustrated in FIG. 13, a radio frequency module 1 according to exemplary Embodiment 9 differs from the radio-frequency module 1 according to exemplary Embodiment 8 (see FIG. 12) in that the radio frequency module 1 includes more than one substrates 6.

(1) Configuration

Referring to FIG. 13, the radio frequency module 1 according to exemplary Embodiment 9 includes a mounting substrate 2, first electronic components 3 (3A to 3C), second electronic components 4, connection terminals 5, substrates 6, and external connection electrodes 7. Constituent elements of the radio frequency module 1 according to exemplary Embodiment 9 that are similar to the corresponding constituent elements of the radio frequency module 1 according to exemplary Embodiment 8 are denoted by the same reference signs, and redundant description thereof will be omitted.

One of the substrates 6 (i.e., a substrate 6A) overlaps the second electronic component 4A when viewed in plan in the thickness direction D1 of the mounting substrate 2. The other substrate 6 (i.e., a substrate 6B) overlaps the second electronic component 4B when viewed in plan in the thickness direction D1 of the mounting substrate 2. The substrate 6 in exemplary Embodiment 9 may have configurations and functions similar to those of the substrate 6 in exemplary Embodiment 8 (see FIG. 12), and redundant description thereof will be omitted.

(2) Exemplary Effects

The radio frequency module 1 according to exemplary Embodiment 9 is similar to the radio frequency module 1 according to exemplary Embodiment 1 in the following respects: at least one external connection electrode 7A included in the external connection electrodes 7 is disposed in the region A1 (see FIG. 3) on the fourth main surfaces 62 of the substrates 6, and the region A1 overlaps at least the second electronic components 4 when viewed in plan in the thickness direction D1 of the mounting substrate 2. The radio frequency module 1 can thus include a greater number of external connection electrodes 7 for connection to the external substrate (not illustrated).

Embodiment 10

Figure 14:
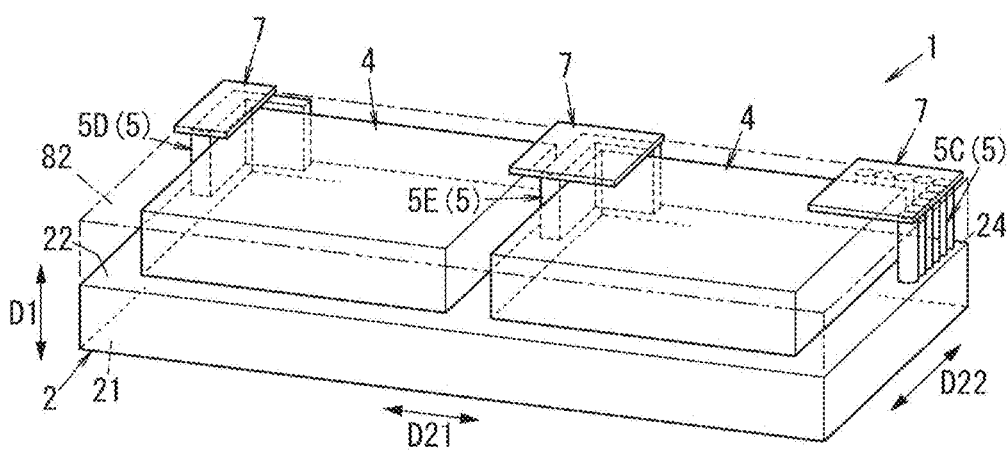
FIG. 14 is a perspective view of a radio frequency module according to exemplary Embodiment 10.

As illustrated in FIG. 14, a radio frequency module 1 according to exemplary Embodiment 10 differs from the radio-frequency module 1 according to exemplary Embodiment 1 (see FIG. 1) in terms of the following configuration.

(1) Configuration

Referring to FIG. 14, the radio frequency module 1 according to exemplary Embodiment 10 includes a mounting substrate 2, first electronic components 3 (see FIG. 2), second electronic components 4, connection terminals 5, substrates 6 (see FIG. 1), and external connection electrodes 7. Constituent elements of the radio frequency module 1 according to Embodiment 10 that are similar to the corresponding constituent elements of the radio frequency module 1 according to Embodiment 1 are denoted by the same reference signs, and redundant description thereof will be omitted.

The connection terminals 5 in exemplary Embodiment 10 include two or more long-length connection terminals 5C, a long-length connection terminal 5D, and a long-length connection terminal 5E. The two or more long-length connection terminals 5C included in the connection terminals 5 in exemplary Embodiment 10 are arranged in an L-shape when viewed in plan in the thickness direction D1 of the mounting substrate 2. The two or more long-length connection terminals 5C arranged in an L-shape are signal terminals (hot terminal) through which radio frequency signals flow. The connection terminals 5 in exemplary Embodiment 10 may have configurations and functions similar to those of the connection terminals 5 in exemplary Embodiment 1 (see FIG. 1), and redundant description thereof will be omitted.

The external connection electrodes 7 in exemplary Embodiment 10 are each in the form of a plate. More specifically, each of the external connection electrodes 7 is greater than each of the connection terminals 5 when viewed in plan in the thickness direction D1 of the mounting substrate 2. Each of the external connection electrodes 7 is, for example, rectangular in shape. The external connection electrodes 7 in exemplary Embodiment 10 may have configurations and functions similar to those of the external connection electrodes 7 in exemplary Embodiment 1 (see FIG. 1), and redundant description thereof will be omitted.

The two or more long-length connection terminals 5C included in the connection terminals 5 in exemplary Embodiment 10 are columnar electrodes each having a small cross-sectional area. The columnar electrodes each having a small cross-sectional area can be disposed on the second main surface 22 of the mounting substrate 2 without overlapping the second electronic components 4. The unusable space on the second main surface 22 of the mounting substrate 2 would be smaller than if the connection terminals 5 are columnar electrodes each having a large cross-sectional area. In other words, the proportion of the installation space for the second electronic components 4 in the second main surface 22 of the mounting substrate 2 can be increased.

The long-length connection terminals 5D and 5E included in the connection terminals 5 are L-shaped or T-shaped when viewed in plan in the thickness direction D1 of the mounting substrate 2. The long-length connection terminals 5D and 5E thus have added strength. The cross-sectional area of each of the long-length connection terminals 5D and 5E that are L-shaped or T-shaped is large enough that the each of the long-length connection terminals 5D and 5E can be more securely bonded to the corresponding one of the external connection electrodes 7.

(2) Exemplary Effects

When the radio frequency module 1 in exemplary Embodiment 10 is viewed in plan in the thickness direction D1 of the mounting substrate 2, each of the external connection electrodes 7 may be larger than each of the connection terminals 5.

The exemplary embodiments and the modifications, which have been described so far, are merely some of the various embodiments and modifications embraced by the present invention. Various alterations may be made to the embodiments and modifications in accordance with, for example, designs in such a manner that the objective of the present invention is achieved.

The expression "elements are disposed on the first main surface of the substrate" may be herein used not only to describe a state in which the elements are mounted directly on the first main surface of the substrate but also to describe a state in which the elements are disposed in one of two spaces separated by the substrate or, more specifically, in a space closer to the first main surface than to the second main surface. That is, the expression "elements are disposed on the first main surface of the substrate" may be herein used not only to describe a state in which the elements are disposed on the first main surface of the substrate with other circuit elements or electrodes interposed between the substrate and the elements. The elements are, for example, the first electronic components 3 but are not limited thereto. The substrate is the mounting substrate 2 or the substrate 6. When the substrate refers to the mounting substrate 2, the first main surface and the second main surface of the substrate are the first main surface 21 and the second main surface 22, respectively. When the substrate refers to the substrate 6, the first main surface and the second main surface of the substrate are the third main surface 61 and the fourth main surface 62, respectively.

The expression "elements are disposed on the second main surface of the substrate" may be herein used not only to describe a state in which the elements are mounted directly on the second main surface of the substrate but also to describe a state in which the elements are disposed in the other one of two spaces separated by the substrate or, more specifically, in a space closer to the second main surface than to the first main surface. That is, the expression "elements are disposed on the second main surface of the substrate" may be used to describe a state in which the elements are disposed on the second main surface of the substrate with other circuit elements or electrodes interposed between the substrate and the elements. The elements are, for example, the second electronic component(s) 4 and the connection terminals 5 but are not limited thereto. The substrate is the mounting substrate 2 or the substrate 6. When the substrate refers to the mounting substrate 2, the first main surface and the second main surface of the substrate are the first main surface 21 and the second main surface 22, respectively. When the substrate refers to the substrate 6, the first main surface and the second main surface refer to the third main surface 61 and the fourth main surface 62, respectively.

The expression "a first element overlaps a second element when viewed in plan in the thickness direction of the substrate" may be herein used to describe a state in which the first element viewed in plan in the direction concerned overlaps the entirety of the second element, a state in which the first element viewed in plan in the direction concerned overlaps part of the second element, a state in which part of the first element viewed in plan in the direction concerned overlaps the entirety of the second element, and a state in which part of the first element viewed in plan in the direction concerned overlaps part of the second element. That is, the expression "the first element overlaps the second element when viewed in plan in the thickness direction of the substrate" may be used to describe a state in which at least part of the first element extends over at least part of the second element. The substrate is the mounting substrate 2 or the substrate 6.

The expression "a third element is disposed between the first element and the second element when viewed in plan in the thickness direction of the substrate" herein means that at least one of lines connecting freely selected points in the first element to freely selected points in the second element passes through the third element when viewed in plan in the thickness direction of the substrate. The expression "when viewed in plan in the thickness direction of the substrate" herein means that the substrate and electronic components on the substrate are viewed in such a manner that they are orthographically projected on a plane parallel to the main surface of the substrate. The substrate is the mounting substrate 2 or the substrate 6.

(Aspects of Disclosure)

The following aspects of the present disclosure are disclosed herein.

According to a first exemplary aspect, a radio-frequency module (1) includes a mounting substrate (2), a first electronic component (3), a second electronic component (4), a plurality of connection terminals (5), and a wiring layer. The mounting substrate (2) has a first main surface (21) and a second main surface (22) on opposite sides. The first electronic component (3) is disposed on the first main surface (21) of the mounting substrate (2). The second electronic component (4) is disposed on the second main surface (22) of the mounting substrate (2). The plurality of connection terminals (5) are disposed on the second main surface (22) of the mounting substrate (2). The wiring layer faces the second main surface (22) of the mounting substrate (2). The wiring layer includes a plurality of external connection electrodes (7). The plurality of external connection electrodes (7) are each connected to at least one of the second electronic component (4) and the plurality of connection terminals (5). At least one of the plurality of external connection electrodes (7) overlaps the second electronic component (4) when viewed in plan in a thickness direction (D1) of the mounting substrate (2).

The radio frequency module (1) according to the first exemplary aspect can thus include a greater number of external connection electrodes (7) for connection to an external substrate.

According to a second exemplary aspect, the radio-frequency module (1) according to the first aspect is as follows: the plurality of external connection electrodes (7) are greater in number than the plurality of connection terminals (5).

The radio frequency module (1) according to the second exemplary aspect can thus include a greater number of external connection electrodes (7) for connection to the external substrate.

According to a third exemplary aspect, the radio-frequency module (1) according to the first or second aspect is as follows: each of the plurality of connection terminals (5) is not equal in diameter to each of the plurality of external connection electrodes (7) ($\varphi 1 \neq \varphi 2$).

The radio frequency module (1) according to the third exemplary aspect is advantageous in that the degree of flexibility in the design of the radio frequency module (1) is increased.

According to a fourth exemplary aspect, the radio-frequency module (1) according to the third aspect is as follows: each of the plurality of external connection electrodes (7) is greater in diameter than each of the plurality of connection terminals (5) ($\varphi 2 > \varphi 1$).

The radio frequency module (1) according to the fourth exemplary aspect can thus be connected to the external substrate with a higher degree of stability.

According to a fifth exemplary aspect, the radio-frequency module (1) according to the third aspect is as follows: each of the plurality of connection terminals (5) is greater in diameter than each of the plurality of external connection electrodes (7) ($\varphi 1 > \varphi 2$).

The radio frequency module (1) according to the fifth exemplary embodiment can achieve an improvement in thermal dissipation and a reduction in electrical resistance.

According to a sixth exemplary aspect, the radio-frequency module (1) according to any one of the first to fifth aspects is as follows. The wiring layer further includes a substrate (6). The substrate (6) has a third main surface (61) and a fourth main surface (62) on opposite sides. The third main surface (61) of the substrate (6) faces at least part of the second main surface (22) of the mounting substrate (2) in the thickness direction (D1) of the mounting substrate (2). The substrate (6) is connected to the mounting substrate (2) with at least one of the second electronic component (4) and the plurality of connection terminals (5) interposed therebetween. The plurality of external connection electrodes (7) are disposed on the fourth main surface (62) of the substrate (6) and are connected to the at least one of the second electronic component (4) and the plurality of connection terminals (5) with the substrate (6) interposed therebetween.

According to a seventh exemplary aspect, the radio-frequency module (1) according to the sixth aspect is as follows: the substrate (6) is thinner than the mounting substrate (2).

This feature of the radio frequency module (1) according to the seventh exemplary aspect enables a reduction in the profile of the radio frequency module (1).

According to an eighth exemplary aspect, the radio-frequency module (1) according to the sixth or seventh aspect is as follows. The substrate (6) is connected to the mounting substrate (2) with the plurality of connection terminals (5) interposed therebetween. Each of the plurality of external connection electrodes (7) is connected to the plurality of connection terminals (5) with the substrate (6) interposed therebetween.

According to a ninth exemplary aspect, the radio-frequency module (1) according to the sixth or seventh aspect is as follows. The substrate (6) is connected to the mounting substrate (2) with the second electronic component (4) and the plurality of connection terminals (5) interposed therebetween. Each of the plurality of external connection electrodes (7) is connected to the second electronic component (4) or the plurality of connection terminals (5) with the substrate (6) interposed therebetween.

According to a tenth exemplary aspect, the radio-frequency module (1) according to the eighth or ninth aspect is as follows: the third main surface (61) of the substrate (6) faces the entirety of the second main surface (22) of the mounting substrate (2) in the thickness direction (D1) of the mounting substrate (2).

According to an eleventh exemplary aspect, the radio-frequency module (1) according to the sixth or seventh aspect is as follows. The substrate (6) is connected to the mounting substrate (2) with the second electronic component (4) interposed therebetween. Each of the plurality of external connection electrodes (7) is connected to the second electronic component (4) with the substrate (6) interposed therebetween. The plurality of connection terminals (5) each have an exposed tip.

According to a twelfth exemplary aspect, the radio-frequency module (1) according to the eleventh aspect is as follows. The radio frequency module (1) includes a plurality of the second electronic components (4). The third main surface (61) of the substrate (6) faces at least one of the plurality of the second electronic components (4).

According to a thirteenth exemplary aspect, the radio-frequency module (1) according to the eleventh or twelfth aspect is as follows. The radio frequency module (1) includes a plurality of the second electronic components (4). At least one of the plurality of connection terminals (5) is disposed between the plurality of second electronic components (4).

According to a fourteenth exemplary aspect, the radio-frequency module (1) according to any one of the first to thirteenth aspects is as follows. The plurality of connection terminals (5) include a long-length connection terminal (5C; 5D; 5E). The long-length connection terminal (5C; 5D; 5E) is longer than it is wide when viewed in plan in the thickness direction (D1) of the mounting substrate (2). The long-length connection terminal (5C; 5D; 5E) is disposed on an end portion (24) of the mounting substrate (2) when viewed in plan in the thickness direction (D1) of the mounting substrate (2). At least one of the plurality of external connection electrodes (7) is connected to the long-length connection terminal (5C; 5D; 5E).

The long-length connection terminal (5C; 5D; 5E) of the radio frequency module (1) according to the fourteenth aspect has added strength, owing to its being disposed on the end portion (24) of the mounting substrate (2) and being longer than it is wide.

According to a fifteenth exemplary aspect, the radio-frequency module (1) according to the fourteenth aspect is as follows: the long-length connection terminal (5D; 5E) is L-shaped when viewed in plan in the thickness direction (D1) of the mounting substrate (2).

The radio frequency module (1) according to the fifteenth exemplary aspect can achieve a reduction in the unusable space on the second main surface (22) of the mounting substrate (2).

According to a sixteenth exemplary aspect, the radio-frequency module (1) according to the fourteenth aspect is as follows: the long-length connection terminal (5D; 5E) is T-shaped when viewed in plan in the thickness direction (D1) of the mounting substrate (2).

The radio frequency module (1) according to the sixteenth exemplary aspect can achieve a reduction in the unusable space on the second main surface (22) of the mounting substrate (2).

According to a seventeenth exemplary aspect, the radio-frequency module (1) according to any one of the fourteenth to sixteenth aspects is as follows. The radio frequency module (1) includes a plurality of the second electronic components (4). The long-length connection terminal (5E) is disposed between the plurality of second electronic components (4).

The radio frequency module (1) according to the seventeenth exemplary aspect can achieve a further reduction in the unusable space on the second main surface (22) of the mounting substrate (2).

According to an eighteenth exemplary aspect, the radio-frequency module (1) according to any one of the fourteenth to seventeenth aspects is as follows. The long-length connection terminal (5C; 5D; 5E) is a signal terminal.

The radio frequency module (1) according to the eighteenth exemplary aspect can achieve a reduction in resistance loss.

According to a nineteenth exemplary aspect, a communication device (9) includes the radio frequency module (1) according to any one of the first to eighteenth aspects and a signal processing circuit (92). The signal processing circuit (92) processes signals flowing through the radio-frequency module (1).

The radio frequency module (1) in the communication device (9) according to the nineteenth exemplary aspect can include a greater number of external connection electrodes (7) for connection to the external substrate.

REFERENCE SIGNS LIST 1 radio frequency module
10 external connection terminal
101 antenna terminal
102 signal input terminal
103 signal output terminal
11 power amplifier
111 input terminal
112 output terminal
121, 122, 123 transmitting filter
131, 132, 133 receiving filter
14 low-noise amplifier
141 input terminal
142 output terminal
15 output matching circuit
16 input matching circuit
17 first switch
171 common terminal
172, 173, 174 selection terminal
18 second switch
181 common terminal
182, 183, 184 selection terminal
19 third switch
191 common terminal
192, 193, 194 selection terminal
2 mounting substrate
21 first main surface
22 second main surface
23 peripheral surface
3, 3A, 3B, 3C first electronic component
32 peripheral surface
33 main surface
4, 4A, 4B second electronic component
41 fifth main surface
42 sixth main surface
43, 44 bump
45 peripheral surface 5A, 5B connection terminal
5D, 5E long-term connection terminal
51 proximal end portion
52 distal end portion
53 peripheral surface
6, 6A, 6B substrate
61 third main surface
62 fourth main surface
7, 7A external connection electrode
71 proximal end portion
72 distal end portion
73 peripheral surface
81 first resin layer
811 main surface
812 peripheral surface
82 second resin layer
821 peripheral surface
83 third resin layer
831 peripheral surface
84 shield layer
9 communication device
91 antenna
92 signal processing circuit
93 RF signal processing circuit
94 baseband signal processing circuit
T1 transmission path
R1 reception path
A1 region
φ1, φ2 diameter
D1 thickness direction
D21 first direction
D22 second direction

The invention claimed is:

1. A radio-frequency module comprising:
a mounting substrate including a first main surface and a second main surface opposite to the first main surface,
a first electronic component disposed on the first main surface of the mounting substrate;
a second electronic component disposed on the second main surface of the mounting substrate;
a plurality of connection terminals disposed on the second main surface of the mounting substrate; and
a wiring layer that faces the second main surface of the mounting substrate, wherein
the wiring layer includes a plurality of external connection electrodes each connected to at least one of the second electronic component and the plurality of connection terminals, and
at least one of the plurality of external connection electrodes overlaps the second electronic component when viewed in plan in a thickness direction of the substrate, and
wherein each of the plurality of connection terminals is greater in diameter than each of the plurality of external connection electrodes.

2. The radio-frequency module according to claim 1, wherein the plurality of external connection electrodes are greater in number than the plurality of connection terminals.

3. The radio-frequency module according to claim 2, wherein each of the plurality of connection terminals is not equal in diameter to each of the plurality of external connection electrodes.

4. The radio-frequency module according to claim 1, wherein each of the plurality of external connection electrodes is greater in diameter than each of the plurality of connection terminals.

5. A communication device comprising:
the radio-frequency module according to claim 1; and
a signal processing circuit that processes signals flowing through the radio-frequency module.

6. The radio-frequency module according to claim 1, wherein
the wiring layer further includes a substrate having a third main surface and a fourth main surface opposite to the third main surface,
the third main surface of the substrate faces at least part of the second main surface of the mounting substrate in the thickness direction of the mounting substrate,
the substrate is connected to the mounting substrate with at least one of the second electronic component and the plurality of connection terminals interposed therebetween, and
the plurality of external connection electrodes are disposed on the fourth main surface of the substrate and are connected to the at least one of the second electronic component and the plurality of connection terminals with the substrate interposed therebetween.

7. The radio-frequency module according to claim 6, wherein the substrate is thinner than the mounting substrate.

8. The radio-frequency module according to claim 6, wherein
the substrate is connected to the mounting substrate with the plurality of connection terminals interposed therebetween, and
each of the plurality of external connection electrodes is connected to the plurality of connection terminals with the substrate interposed therebetween.

9. The radio-frequency module according to claim 8, wherein the third main surface of the substrate faces entirety of the second main surface of the mounting substrate in the thickness direction of the mounting substrate.

10. The radio-frequency module according to claim 6, wherein
the substrate is connected to the mounting substrate with the second electronic component and the plurality of connection terminals interposed therebetween, and
each of the plurality of external connection electrodes is connected to the second electronic component or the plurality of connection terminals with the substrate interposed therebetween.

11. The radio-frequency module according to claim 6, wherein
the substrate is connected to the mounting substrate with the second electronic component interposed therebetween, and
each of the plurality of external connection electrodes is connected to the second electronic component with the substrate interposed therebetween, and
the plurality of connection terminals each have an exposed tip.

12. The radio-frequency module according to claim 11, wherein
the radio-frequency module comprises a plurality of the second electronic components, and
the third main surface of the substrate faces at least one of the plurality of the second electronic components.

13. The radio-frequency module according to claim 11, wherein
the radio-frequency module comprises a plurality of the second electronic components, and
at least one of the plurality connection terminals is disposed between the plurality of second electronic components.

14. The radio-frequency module according to claim 1, wherein the plurality of connection terminals include a long-length connection terminal that is longer than it is wide when viewed in plan in the thickness direction of the mounting substrate, the long-length connection terminal is disposed on an end portion of the mounting substrate when viewed in plan in the thickness direction of the mounting substrate, and at least one of the plurality of external connection electrodes is connected to the long-length connection terminal.

15. The radio-frequency module according to claim 14, wherein the long-length connection terminal is L-shaped when viewed in plan in the thickness direction of the mounting substrate.

16. The radio-frequency module according to claim 14, wherein the long-length connection terminal is T-shaped when viewed in plan in the thickness direction of the mounting substrate.

17. The radio-frequency module according to claim 14, wherein the radio-frequency module comprises a plurality of the second electronic components, and the long-length connection terminal is disposed between the plurality of second electronic components.

18. The radio-frequency module according to claim 14, wherein the long-length connection terminal is a signal terminal.

* * * * *